(12) United States Patent
Im et al.

(10) Patent No.: US 8,796,159 B2
(45) Date of Patent: Aug. 5, 2014

(54) PROCESSES AND SYSTEMS FOR LASER CRYSTALLIZATION PROCESSING OF FILM REGIONS ON A SUBSTRATE UTILIZING A LINE-TYPE BEAM, AND STRUCTURES OF SUCH FILM REGIONS

(75) Inventors: James S. Im, New York, NY (US); Paul Christiaan van der Wilt, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 459 days.

(21) Appl. No.: 11/373,772

(22) Filed: Mar. 9, 2006

(65) Prior Publication Data

US 2007/0010104 A1   Jan. 11, 2007

Related U.S. Application Data

(63) Continuation of application No. PCT/US2004/030330, filed on Sep. 16, 2004.

(60) Provisional application No. 60/503,361, filed on Sep. 16, 2003.

(51) Int. Cl.
*H01L 21/00* (2006.01)

(52) U.S. Cl.
USPC .................................. 438/795; 257/E21.582

(58) Field of Classification Search
USPC .................................. 438/795; 257/E21.582
See application file for complete search history.

(56) References Cited

U.S. PATENT DOCUMENTS 3,632,205 A   1/1972   Marcy
4,187,126 A   2/1980   Radd et al.
(Continued)

FOREIGN PATENT DOCUMENTS

DE   19839718   3/2000
DE   10103670   8/2002
(Continued)

OTHER PUBLICATIONS

U.S. Appl. No. 10/524,809—Notice of Allowance mailed on Nov. 18, 2009.

(Continued)

*Primary Examiner* — Matthew Landau
*Assistant Examiner* — Igwe U Anya
(74) *Attorney, Agent, or Firm* — Baker Botts L.L.P.

(57) ABSTRACT

Process and system for processing a thin film sample, as well as at least one portion of the thin film structure are provided. Irradiation beam pulses can be shaped to define at least one line-type beam pulse, which includes a leading portion, a top portion and a trailing portion, in which at least one part has an intensity sufficient to at least partially melt a film sample. Irradiating a first portion of the film sample to at least partially melt the first portion, and allowing the first portion to resolidify and crystallize to form an approximately uniform area therein. After the irradiation of the first portion of the film sample, irradiating a second portion using a second one of the line-type beam pulses to at least partially melt the second portion, and allowing the second portion to resolidify and crystallize to form an approximately uniform area therein. A section of the first portion impacted by the top portion of the first one of the line-type beam pulses is prevented from being irradiated by trailing portion of the second one of the line-type beam pulses.

18 Claims, 15 Drawing Sheets

(56) References Cited

U.S. PATENT DOCUMENTS

| | | | |
|---|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,804,978 A | 2/1989 | Tracy |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,095,473 A | 3/1992 | Gotoh |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,432,122 A | 7/1995 | Chae |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,534,716 A | 7/1996 | Takemura |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,643,801 A | 7/1997 | Ishihara et al. |
| 5,663,579 A | 9/1997 | Noguchi |
| 5,683,935 A | 11/1997 | Miyamoto |
| 5,696,388 A | 12/1997 | Funada et al. |
| 5,710,050 A | 1/1998 | Makita et al. |
| 5,719,617 A * | 2/1998 | Takahashi et al. ............ 347/241 |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,846,678 A * | 12/1998 | Nishigori et al. ............... 430/30 |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita |
| 5,981,974 A | 11/1999 | Makita |
| 5,986,807 A | 11/1999 | Fork |
| 6,002,523 A | 12/1999 | Tanaka |
| 6,014,944 A | 1/2000 | Russell et al. |
| 6,020,224 A | 2/2000 | Shimogaichi et al. |
| 6,045,980 A | 4/2000 | Edelkind et al. |
| 6,072,631 A | 6/2000 | Guenther et al. |
| 6,081,319 A * | 6/2000 | Ozawa et al. ..................... 355/67 |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A * | 10/2000 | Higashi ........................ 438/166 |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 * | 1/2001 | Aklufi et al. ..................... 117/4 |
| 6,177,301 B1 | 1/2001 | Jung |
| 6,184,490 B1 | 2/2001 | Schweizer |
| 6,187,088 B1 * | 2/2001 | Okumura ........................ 117/8 |
| 6,190,985 B1 | 2/2001 | Buynoski |
| 6,193,796 B1 * | 2/2001 | Yang .............................. 117/4 |
| 6,194,023 B1 * | 2/2001 | Mitsuhashi et al. ............. 427/8 |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B1 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |

(56) References Cited

U.S. PATENT DOCUMENTS

| | | | |
|---|---|---|---|
| 6,531,681 B1 | 3/2003 | Markle et al. | |
| 6,535,535 B1 | 3/2003 | Yamazaki et al. | |
| 6,555,422 B1 | 4/2003 | Yamazaki et al. | |
| 6,555,449 B1 | 4/2003 | Im et al. | |
| 6,562,701 B2 | 5/2003 | Ishida et al. | |
| 6,563,077 B2 | 5/2003 | Im | |
| 6,573,163 B2 | 6/2003 | Voutsas et al. | |
| 6,573,531 B1 | 6/2003 | Im et al. | |
| 6,577,380 B1 | 6/2003 | Sposili et al. | |
| 6,582,827 B1 | 6/2003 | Im | |
| 6,590,228 B2 | 7/2003 | Voutsas et al. | |
| 6,599,790 B1 | 7/2003 | Yamazaki et al. | |
| 6,602,765 B2* | 8/2003 | Jiroku et al. | 438/487 |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 | 10/2003 | Grigoropoulos et al. | |
| 6,660,575 B1 | 12/2003 | Zhang | |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,741,621 B2 | 5/2004 | Asano | |
| 6,744,069 B1 | 6/2004 | Yamazaki et al. | |
| 6,746,942 B2 | 6/2004 | Sato et al. | |
| 6,750,424 B2 | 6/2004 | Tanaka | |
| 6,755,909 B2 | 6/2004 | Jung | |
| 6,767,804 B2 | 7/2004 | Crowder | |
| 6,770,545 B2 | 8/2004 | Yang | |
| 6,777,276 B2 | 8/2004 | Crowder et al. | |
| 6,784,455 B2 | 8/2004 | Maekawa et al. | |
| 6,830,993 B1 | 12/2004 | Im et al. | |
| 6,858,477 B2 | 2/2005 | Deane et al. | |
| 6,861,328 B2 | 3/2005 | Hara et al. | |
| 6,908,835 B2 | 6/2005 | Sposili et al. | |
| 6,916,690 B2 | 7/2005 | Chang | |
| 6,961,117 B2 | 11/2005 | Im | |
| 6,962,860 B2 | 11/2005 | Yamazaki et al. | |
| 7,049,184 B2 | 5/2006 | Tanabe | |
| 7,091,411 B2 | 8/2006 | Falk et al. | |
| 7,119,365 B2 | 10/2006 | Takafuji et al. | |
| 7,164,152 B2 | 1/2007 | Im | |
| 7,172,952 B2 | 2/2007 | Chung | |
| 7,183,229 B2 | 2/2007 | Yamanaka | |
| 7,187,016 B2 | 3/2007 | Arima | |
| 7,192,479 B2 | 3/2007 | Mitani et al. | |
| 7,192,818 B1 | 3/2007 | Lee et al. | |
| 7,199,397 B2 | 4/2007 | Huang et al. | |
| 7,217,605 B2 | 5/2007 | Kawasaki et al. | |
| 7,259,081 B2 | 8/2007 | Im | |
| 7,297,982 B2 | 11/2007 | Suzuki et al. | |
| 7,300,858 B2 | 11/2007 | Im | |
| 7,311,778 B2 | 12/2007 | Im et al. | |
| 7,318,866 B2 | 1/2008 | Im | |
| 7,319,056 B2 | 1/2008 | Im et al. | |
| 7,326,876 B2 | 2/2008 | Jung | |
| 7,341,928 B2 | 3/2008 | Im | |
| 7,364,952 B2* | 4/2008 | Im | 438/150 |
| 7,384,476 B2 | 6/2008 | You | |
| 7,507,645 B2 | 3/2009 | You | |
| 7,560,321 B2 | 7/2009 | Kato et al. | |
| 7,645,337 B2 | 1/2010 | Im | |
| 7,700,462 B2 | 4/2010 | Tanaka et al. | |
| 7,804,647 B2 | 9/2010 | Mitani et al. | |
| 2001/0001745 A1 | 5/2001 | Im et al. | |
| 2001/0029089 A1* | 10/2001 | Tanaka | 438/479 |
| 2001/0030292 A1* | 10/2001 | Brotherton | 250/492.2 |
| 2001/0041426 A1 | 11/2001 | Im | |
| 2002/0083557 A1 | 7/2002 | Jung | |
| 2002/0096680 A1 | 7/2002 | Sugano et al. | |
| 2002/0104750 A1 | 8/2002 | Ito | |
| 2002/0119609 A1 | 8/2002 | Hatano et al. | |
| 2002/0130279 A1* | 9/2002 | Jain et al. | 250/494.1 |
| 2002/0151115 A1 | 10/2002 | Nakajima et al. | |
| 2002/0197778 A1 | 12/2002 | Kasahara et al. | |
| 2003/0000455 A1* | 1/2003 | Voutsas | 117/47 |
| 2003/0003242 A1 | 1/2003 | Voutsas | |
| 2003/0006221 A1 | 1/2003 | Hong et al. | |
| 2003/0013278 A1 | 1/2003 | Jang et al. | |
| 2003/0014337 A1 | 1/2003 | Mathews et al. | |
| 2003/0022471 A1* | 1/2003 | Taketomi et al. | 438/496 |
| 2003/0029212 A1 | 2/2003 | Im | |
| 2003/0042430 A1* | 3/2003 | Tanaka et al. | 250/492.1 |
| 2003/0057418 A1 | 3/2003 | Asano | |
| 2003/0060026 A1* | 3/2003 | Yamazaki et al. | 438/479 |
| 2003/0068836 A1 | 4/2003 | Hongo et al. | |
| 2003/0089907 A1 | 5/2003 | Yamaguchi et al. | |
| 2003/0096489 A1 | 5/2003 | Im et al. | |
| 2003/0119286 A1 | 6/2003 | Im et al. | |
| 2003/0123051 A1* | 7/2003 | McGrew | 356/72 |
| 2003/0148565 A1 | 8/2003 | Yamanaka | |
| 2003/0148594 A1* | 8/2003 | Yamazaki et al. | 438/487 |
| 2003/0194613 A1 | 10/2003 | Voutsas et al. | |
| 2003/0196589 A1 | 10/2003 | Mitani et al. | |
| 2004/0040938 A1 | 3/2004 | Yamazaki et al. | |
| 2004/0041158 A1* | 3/2004 | Hongo et al. | 257/79 |
| 2004/0053450 A1 | 3/2004 | Sposili et al. | |
| 2004/0061843 A1 | 4/2004 | Im | |
| 2004/0127066 A1 | 7/2004 | Jung | |
| 2004/0140470 A1 | 7/2004 | Kawasaki et al. | |
| 2004/0169176 A1 | 9/2004 | Peterson et al. | |
| 2004/0182838 A1 | 9/2004 | Das et al. | |
| 2004/0209447 A1* | 10/2004 | Gosain et al. | 438/486 |
| 2004/0222187 A1 | 11/2004 | Lin | |
| 2004/0224487 A1 | 11/2004 | Yang | |
| 2005/0003591 A1 | 1/2005 | Takaoka et al. | |
| 2005/0032249 A1 | 2/2005 | Im et al. | |
| 2005/0034653 A1 | 2/2005 | Im et al. | |
| 2005/0059224 A1 | 3/2005 | Im | |
| 2005/0059265 A1 | 3/2005 | Im | |
| 2005/0112906 A1 | 5/2005 | Maekawa et al. | |
| 2005/0139830 A1 | 6/2005 | Takeda et al. | |
| 2005/0141580 A1 | 6/2005 | Partlo et al. | |
| 2005/0142450 A1 | 6/2005 | Jung | |
| 2005/0142451 A1 | 6/2005 | You | |
| 2005/0202654 A1 | 9/2005 | Im | |
| 2005/0235903 A1 | 10/2005 | Im | |
| 2005/0236908 A1 | 10/2005 | Rivin | |
| 2006/0030164 A1* | 2/2006 | Im | 438/795 |
| 2006/0035478 A1 | 2/2006 | You | |
| 2006/0040512 A1 | 2/2006 | Im | |
| 2006/0102901 A1 | 5/2006 | Im et al. | |
| 2006/0125741 A1 | 6/2006 | Tanaka et al. | |
| 2006/0211183 A1 | 9/2006 | Duan et al. | |
| 2006/0254500 A1 | 11/2006 | Im et al. | |
| 2007/0007242 A1 | 1/2007 | Im | |
| 2007/0010074 A1 | 1/2007 | Im | |
| 2007/0010104 A1 | 1/2007 | Im | |
| 2007/0020942 A1 | 1/2007 | Im | |
| 2007/0032096 A1 | 2/2007 | Im | |
| 2007/0051302 A1 | 3/2007 | Gosain et al. | |
| 2007/0108472 A1 | 5/2007 | Jeong et al. | |
| 2007/0111349 A1 | 5/2007 | Im | |
| 2007/0184638 A1 | 8/2007 | Kang et al. | |
| 2007/0215942 A1 | 9/2007 | Chen et al. | |
| 2008/0035863 A1 | 2/2008 | Im et al. | |
| 2008/0124526 A1 | 5/2008 | Im | |
| 2008/0176414 A1 | 7/2008 | Im | |
| 2009/0001523 A1 | 1/2009 | Im | |
| 2009/0045131 A1 | 2/2009 | Im | |
| 2009/0137105 A1 | 5/2009 | Im | |
| 2009/0173948 A1 | 7/2009 | Im et al. | |
| 2009/0189164 A1 | 7/2009 | Im et al. | |
| 2009/0218577 A1 | 9/2009 | Im | |
| 2009/0242805 A1 | 10/2009 | Im | |
| 2009/0309104 A1 | 12/2009 | Im | |
| 2010/0024865 A1 | 2/2010 | Shah et al. | |
| 2010/0032586 A1 | 2/2010 | Im et al. | |
| 2010/0065853 A1 | 3/2010 | Im | |
| 2010/0099273 A1 | 4/2010 | Im | |

(56) References Cited

U.S. PATENT DOCUMENTS

| | | |
|---|---|---|
| 2010/0197147 A1 | 8/2010 | Im |
| 2010/0233888 A1 | 9/2010 | Im |

FOREIGN PATENT DOCUMENTS

| | | |
|---|---|---|
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | S57-027035 | 2/1982 |
| JP | S62-160781 | 7/1987 |
| JP | 62181419 | 8/1987 |
| JP | S62-216320 | 9/1987 |
| JP | H01-256114 | 10/1989 |
| JP | H02-081422 | 3/1990 |
| JP | 2283036 | 11/1990 |
| JP | 04033327 | 2/1992 |
| JP | H04-167419 | 6/1992 |
| JP | 4279064 | 10/1992 |
| JP | H04-282869 | 10/1992 |
| JP | 5 041519 | 2/1993 |
| JP | H05-048190 | 2/1993 |
| JP | 06-011729 | 1/1994 |
| JP | 6252048 | 9/1994 |
| JP | H06-260502 | 9/1994 |
| JP | 6283422 | 10/1994 |
| JP | 7176757 | 7/1995 |
| JP | H08-078330 | 3/1996 |
| JP | H09-007968 | 1/1997 |
| JP | 1997-171971 | 6/1997 |
| JP | H09-270393 | 9/1997 |
| JP | 9260681 | 10/1997 |
| JP | 9321310 A | 12/1997 |
| JP | 10 189998 | 7/1998 |
| JP | H10-244390 | 9/1998 |
| JP | 11064883 | 3/1999 |
| JP | 11281997 | 10/1999 |
| JP | H11-297852 | 10/1999 |
| JP | 11330000 | 11/1999 |
| JP | 2000-223425 | 8/2000 |
| JP | 2000-315652 | 11/2000 |
| JP | 2000-346618 | 12/2000 |
| JP | 2001023920 | 1/2001 |
| JP | 2002-203809 | 7/2002 |
| JP | 2002-353142 | 12/2002 |
| JP | 2002-353159 | 12/2002 |
| JP | 2003-031496 | 1/2003 |
| JP | 2003-100653 | 4/2003 |
| JP | 2003-523723 | 8/2003 |
| JP | 2004-031809 | 1/2004 |
| KR | 2000-0053428 | 8/2000 |
| TW | 464960 | 11/2001 |
| TW | 564465 | 12/2003 |
| TW | 569350 | 1/2004 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | WO 0173769 | 10/2001 |
| WO | WO 0197266 | 12/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 03046965 | 6/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |
| WO | WO 2004030328 | 9/2004 |
| WO | WO2005029546 | 3/2005 |
| WO | WO2005029548 | 3/2005 |
| WO | WO 2005029549 | 3/2005 |
| WO | WO2005029550 | 3/2005 |
| WO | WO2005029551 | 3/2005 |
| WO | WO 2006/055003 | 5/2006 |

OTHER PUBLICATIONS

U.S. Appl. No. 12/708,307—Filed Continuation of U.S. Appl. No. 10/524,809 on Feb. 18, 2010.
U.S. Appl. No. 12/708,307, Nov. 10, 2010, Notice of Allowance.
Bergmann et al., "The future of crystalline silicon films on foreign substrates," Thin Solid Films 403-404 (2002) 162-169.
U.S. Appl. No. 13/019,042, filed Feb. 1, 2011.
Jeon et al., "New Excimer Laser Recrystallization of Poly-Si for Effective Grain Growth and Grain Boundary Arrangement," Jpn. J. Appl. Phys. vol. 39 (2000) pp. 2010-2014, Apr. 2000.
U.S. Appl. No. 12/708,307, Sep. 27, 2010, Preliminary Amendment.
U.S. Appl. No. 12/708,307, Oct. 7, 2010, Notice of Allowance.
Gosain et al. Formation of (100)-Textured Si Film Using an Excimer Laser on a Glass Substrate, Jpn. J. Appl. Phys., vol. 42 (2003) pp. L135-L137.
U.S. Appl. No. 10/524,809—Sep. 3, 2009; Response to Non-Final Rejection.
U.S. Appl. No. 10/524,809—Aug. 12, 2009; Examiner Interview (Summary).
U.S. Appl. No. 10/524,809—May 7, 2009; Non-Final Rejection.
U.S. Appl. No. 10/524,809—Feb. 6, 2009; Response to Non-Final Rejection.
U.S. Appl. No. 10/524,809—Sep. 17, 2008; Non-Final Rejection.
van der Wilt et al., "A hybrid approach for obtaining orientation-controlled single-crystal Si regions on glass substrates", Proc. of SPIE vol. 6106, 61060B-1-B-15, (2006) XP009151485.
U.S. Appl. No. 60/253,256, filed Aug. 31, 2003, Im.
Im et al., "Controlled Super-Lateral Growth of Si Films for Microstructural Manipulation and Optimization", Phys. Stat. Sol. (a), vol. 166, p. 603 (1998).
S.D. Brotherton et al., "Influence of Melt Depth in Laser Crystallized Poly-Si Thin Film Transistors," 82 J. Appl. Phys. 4086 (1997).
J.S. Im et al., "Crystalline Si Films for Integrated Active-Matrix Liquid-Crystals Displays," 21 MRS Bulletin 39 (1996).
Im et al., "Single-Crystal Si Films for Thin-Film Transistor Devices," Appl. Phys. Lett., vol. 70 (25), p. 3434 (1997).
Sposili et al., "Sequential Lateral Solidification of Thin Silicon Films on SiO2", Appl, Phys. Lett., vol. 69 (19), p. 2864 (1996).
Crowder et al., "Low-Temperature Single-Crystal Si TFT's Fabricated on Si Films processed via Sequential Lateral Solidification", IEEE Electron Device Letter, vol. 19 (8), p. 306 (1998).
Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.
C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.
J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.
H. Endert et al., "Excimer Laser: A New Tool for Precision Micromaching," 27 Optical and Quantum Electronics, 1319 (1995).
"Overview of Beam Delivery Systems for Excimer Lasers," Micro/Las Lasersystem GMBH. 1999.
K.H. Weiner et al., "Ultrashallow Junction Formation Using Projection Gas Immersion Laser Doping (PGILD)," A Verdant Technologies Technical Brief, Aug. 20, 1997.

(56) References Cited

OTHER PUBLICATIONS

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994-vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9. 7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, U.S. Appl. No. 60/503,419; ref. file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

(56) References Cited

OTHER PUBLICATIONS

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3 , 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization, J. Electrochem. Soc.: Solid-State Science and Technology," Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

van der Wilt, P.C., "State-of-the-Art Laser Crystallization of Si for Flat Panel Displays," PhAST, May 18, 2004, pp. 1-34.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

Andra et al., "Multicrystalline LLC-SI Thin Film Solar Cells on Low Temperature Glass", *3rd World Conference on Photovoltaic Energy Conversion* May 11-18, 2003, Osaka, Japan, Poster, pp. 1174-1177 (2003).

Andra et al., "A new technology for crystalline silicon thin film solar cells on glass based on laser crystallization", *Photovoltiac Specialists Conference. Conference Record of the Twenty-Eight IEEE*, pp. 217-220 (2000).

Sinke et al., "Explosive crystallization of amorphous silicon: Triggering and propagation", *Applied Surface Science*, 43:128-135 (1989).

\* cited by examiner

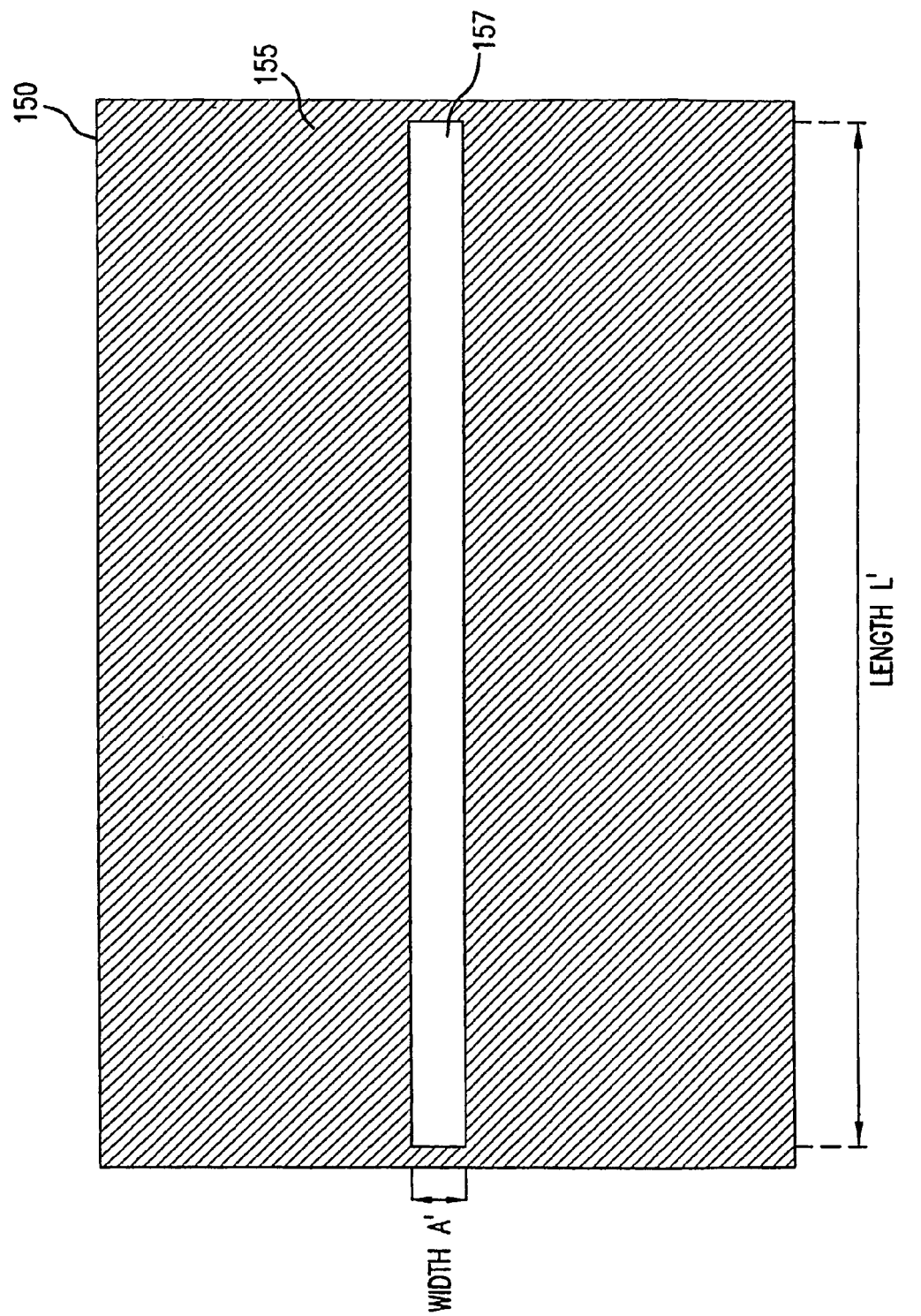

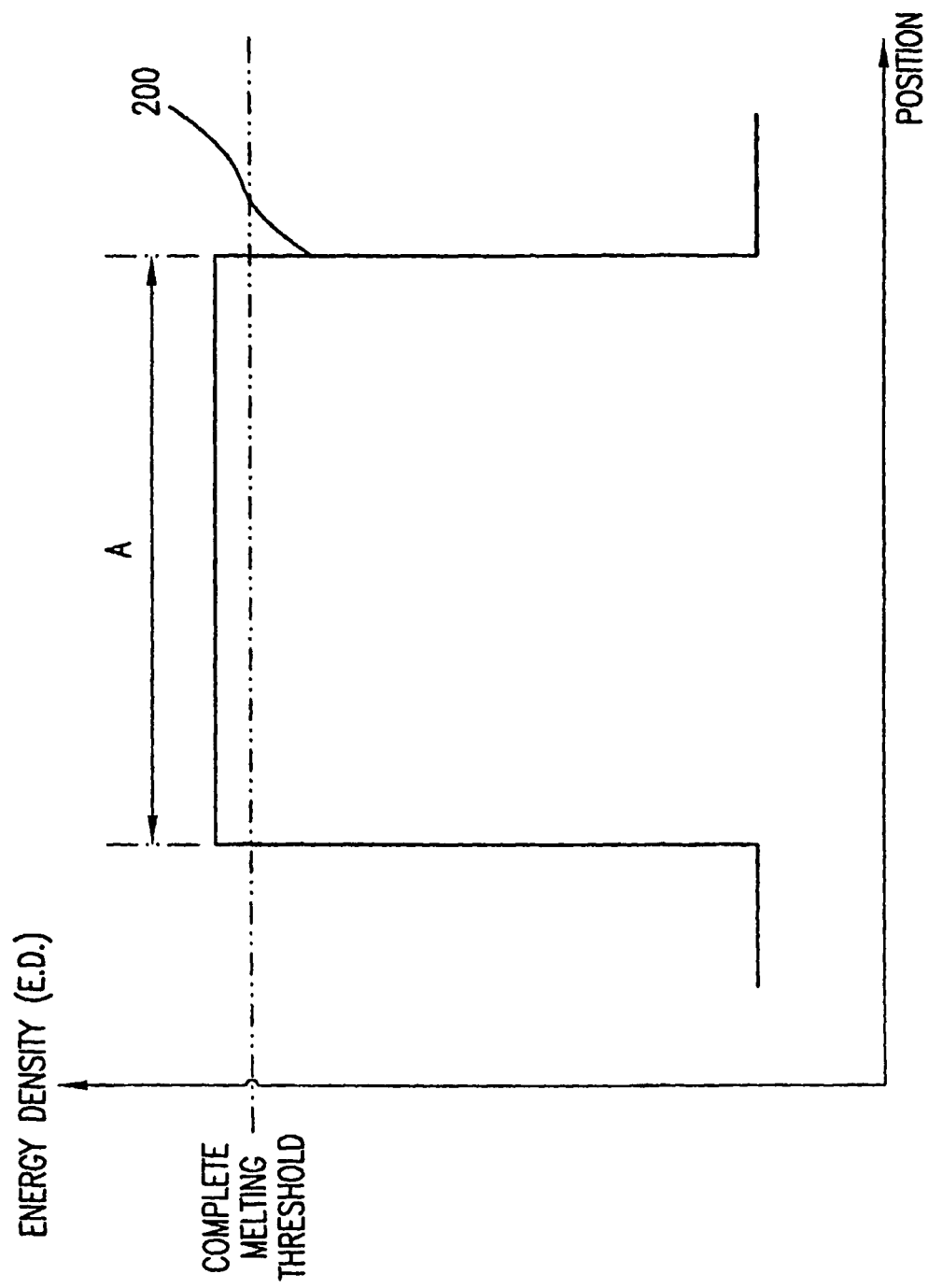

PROCESSES AND SYSTEMS FOR LASER CRYSTALLIZATION PROCESSING OF FILM REGIONS ON A SUBSTRATE UTILIZING A LINE-TYPE BEAM, AND STRUCTURES OF SUCH FILM REGIONS

CROSS-REFERENCE TO RELATED APPLICATIONS

This application is a continuation of International Application Serial No. PCT/US04/030330, filed Sep. 16, 2004, published Mar. 31, 2005, which claims priority from U.S. Provisional Application Ser. No. 60/503,361, filed Sep. 16, 2003, each of which are incorporated by reference in their entireties herein, and from which priority is claimed.

FIELD OF THE INVENTION

The present invention relates to techniques for processing of films, and more particularly to location-controlled techniques for processing semiconductor films using a line-type beam so as to obtain a substantial uniformity of certain regions of the thin films in which microstructures (e.g., thin-film transistor "TFT" devices) can be situated.

BACKGROUND OF THE INVENTION

Semiconductor films, such as silicon films, are known to be used for providing pixels for liquid crystal display devices. Certain prior art systems utilize line-type beams which are shaped to have a particular line-shape. An exemplary illustration of the line-type beam pulse 200, and a profile thereof are illustrated in FIG. 4A. In particular, the line beam pulse 200 may defined by a length L and width W'. The profile of the line-type beam pulse 200 illustrated in FIG. 4A has a convex top portion 205, a large section of which has sufficient energy density to be below a complete melting energy density threshold. This profile of the line-type beam pulse 200 also has a leading portion 210 and a trailing portion 215. The leading portion 210 has an energy density beginning from a low or negligible energy density level, continuing to reach a crystallization threshold, and ending below the complete melting energy density threshold so as to reach the convex top portion 205. The trailing edge portion 215 has an energy density starting from the edge of the convex top portion 205 (which is at a sufficient energy below the complete melting energy density threshold), passing the crystallization threshold, and ending at the low or negligible energy density level. The length L of the line beam can be between 10 cm and 50 cm so as to irradiate a significant section of a thin film provided on a sample. The conventional system generally use line beam pulses to irradiate the same section of the sample over 10 times with the energy density which is somewhat below the complete melting threshold. In this manner, a more uniform film may be attained, but the processing of such film is extremely slow. Indeed, the systems which use such line-type beam 200 are currently not suitable for quick processing of samples. In addition, when the edge portions (i.e., the leading and trailing edge portions 210, 215) irradiate the corresponding sections of the thin film, non-uniformity may be created in these sections.

As shown in FIG. 4B, other conventional systems attempt to overcome these problems associated with non-uniformity by continuously scanning display areas 220, 225 of the sample 180, until the entire area is completely irradiated. As shown in FIG. 5, this is generally performed by irradiating areas of the sample using successive pulses of the line-type beam 200, such that a significant portion of the area irradiated by a first pulse 300 of the beam 200 is subsequently irradiated by the next pulse 310. It follows that a sizable portion of the area of the sample irradiated by the pulse 310 is reirradiated by the subsequent pulse 320. Also, a large portion of the area irradiated by the pulse 320 is reirradiated by the next pulse 330, and so on. The overlap of the areas irradiated by the adjacent pulses is provided such that the distance between the adjacent pulses is the width of the top portion of the pulse divided by between 10 and 100, and preferably divided by approximately 20.

It may be possible to reduce the non-uniformity of the irradiated sections of the thin film sample by maintaining the energy density of the line-type beam pulse 200 to be above the complete melting threshold. In particular, as shown in FIGS. 6A and 6B, sections of a thin film sample irradiated at an energy density above the complete melting threshold 250 form small polycrystalline grains compared to sections of the thin film sample irradiated at an energy density below the complete melting threshold. Between these sections, there is a narrow region where grains are very large, due to near-complete melting of the film. In addition, when the energy density is below the crystallization threshold, the irradiated area is amorphous.

It is conceivable to reduce the non-uniformity of the irradiated sections of the thin film sample by maintaining the energy density of the line-type beam pulse 200 to be below the complete melting threshold. In particular, as shown in FIGS. 6C and 6D, sections of a thin film sample irradiated with beam pulses 200 at a constant energy density that is above the crystallization threshold and below the complete melting threshold 205' have an approximately uniform grain size.

However, there are disadvantages to the use of these conventional methods. For example, when the irradiated areas of the thin film are required to be overlapped, the processing time of the entire sample is slow. This is because the sample is processed to ensure the reirradiation of significant parts of the previously irradiated areas of the thin film.

SUMMARY OF THE INVENTION

One of the objects of the present invention is to provide an improved process and system which irradiate at least one thin film section of the substrate using a line-type beam pulses so as to at least partially melt these sections, and without the irradiated areas being re-irradiated by the following beam pulses. In this manner, the melted sections of the thin film sections resolidify to form substantially uniform crystallized regions therein. Due to the uniformity of these regions of the resolidified thin film sections, it is possible to place the TFT devices in such regions. Thus, the TFT devices situated in such manner would likely have at least similar performance with respect to one another. Another object of the present invention is to continuously translate and irradiate one or more sections of the thin film sample (e.g., without stopping) such that the above-described uniformity is achieved in an accelerated manner.

In one exemplary embodiment of the present invention, a process and system for processing a semiconductor thin film sample, as well as at least one portion of the semiconductor thin film structure are provided. In particular, a beam generator can be controlled to emit successive irradiation beam pulses at a predetermined repetition rate. Each of the irradiation beam pulses can be shaped to define at least one line-type beam pulse, with the line-type beam pulses being provided for impinging the film sample. These line-type beam pulses can include at least one part which have an intensity sufficient to at least partially melt irradiated portions of the film sample. Thereafter, a first portion of the film sample is irradiated using a first one of the line-type beam pulses to at least partially melt the first portion, with the irradiated first portion being allowed to resolidify and crystallize. After the irradiation of the first portion of the film sample, a second portion of the film sample is irradiated using a second one of the line-type beam pulses to at least partially melt the second portion, with the irradiated second portion also being allowed to resolidify and crystallize. An emission of the second one of the line-type beam pulses may immediately follow an emission of the first one of the line-type beam pulses. A profile of each of the line-type beam pulses may includes a leading portion, a top portion and a trailing portion. For example, a section of the first portion impacted by the top portion of the first one of the line-type beam pulses may be prevented from being irradiated by trailing portion of the second one of the line-type beam pulses.

In another exemplary embodiment of the present invention, the first portion of the film sample is irradiated by the top portion of the first one of the line-type beam pulses, wherein the second portion of the film sample is irradiated by the top portion of the second one of the line-type beam pulses. The top portion of each of the line-type beam pulses may have energy density which is above a complete melting threshold Each of the leading and trailing portions of the first one of the line-type beam pulses can irradiate a part of the first portion, and each of the leading and trailing portions of the second one of the line-type beam pulses can irradiate a part of the second portion. In addition, each of leading and trailing portions of the first and second ones of the line-type beam pulses may include first and second sections. Each of the first sections of the leading and trailing portions of the first and second ones of the line-type beam pulses may include an energy density which is sufficient to at least partially melt the respective first portion and/or the respective second portion. Also, each of the second sections of the leading and trailing portions of the first and second ones of the line-type beam pulses can have an energy density lower than a threshold level which is sufficient to at least partially melt the part of one of the respective first portion and the respective second portion. The second portion can be irradiated after the irradiation of the first portion and after the film sample is translated for a particular distance with respect to an impingement by the beam pulses of the first portion. The first section of the leading portion of the first one of the line-type beam pulses may have a first length, and the first section of the trailing portion of the second one of the line-type beam pulses can have a second length. The top portion may have a third length. The particular distance can be greater than the sum of the third length and of the larger one of the first and second lengths.

According to still another embodiment of the present invention, data associated with locations on the film sample to be irradiated is received. Then, after the irradiation of the first portion and before the irradiation of the second portion, the film sample is translated for a particular distance with respect to an impingement by the beam pulses based on such received data. The irradiation beam pulses can be shaped by a mask to define the line-type beam pulses. In addition, the first and second ones of the line-type beam pulses can at least partially melt the respective first and second portions of the film sample. Furthermore, the film sample can be translated for the particular distance with respect to an impingement by the beam pulses in a periodic manner and also based on an irradiation frequency of the irradiation beam generator. Also, the first and second portions of the film sample can include pixel areas. In addition, the first and second portions can include areas, which are configured to situate thereon an active region of at least one thin-film transistor "TFT" device.

The accompanying drawings, which are incorporated and constitute part of this disclosure, illustrate a preferred embodiment of the invention and serve to explain the principles of the invention.

BRIEF DESCRIPTION OF THE DRAWINGS

FIG. 2 is a top view of an exemplary embodiment of a mask according to the present invention utilized by the system illustrated FIG. 1A, which patterns a beam so as to have a line-type shape for irradiating the selected areas of the semiconductor thin film;

FIG. 8 is a cross-sectional profile of another exemplary line-type beam which can be shaped by optics of the system of FIG. 1A and/or patterned by the mask of FIG. 2, and which has either minimal or insignificant sloping edge portions;

DETAILED DESCRIPTION

It should be understood that various systems and methods according to the present invention can be utilized to at least partially melt, then solidify and crystallize one or more areas on a semiconductor thin film (e.g., silicon) using line-type beam pulses, while continuously translating the sample and without re-irradiating the previously irradiated and resolidified areas to generate substantially uniform regions on the thin film. The exemplary embodiments of the systems and process to generate such areas, as well as of the resulting crystallized semiconductor thin films shall be described in further detail below. However, it should be understood that the present invention is in no way limited to the exemplary embodiments of the systems, processes and semiconductor thin films described herein.

Figure 1A:
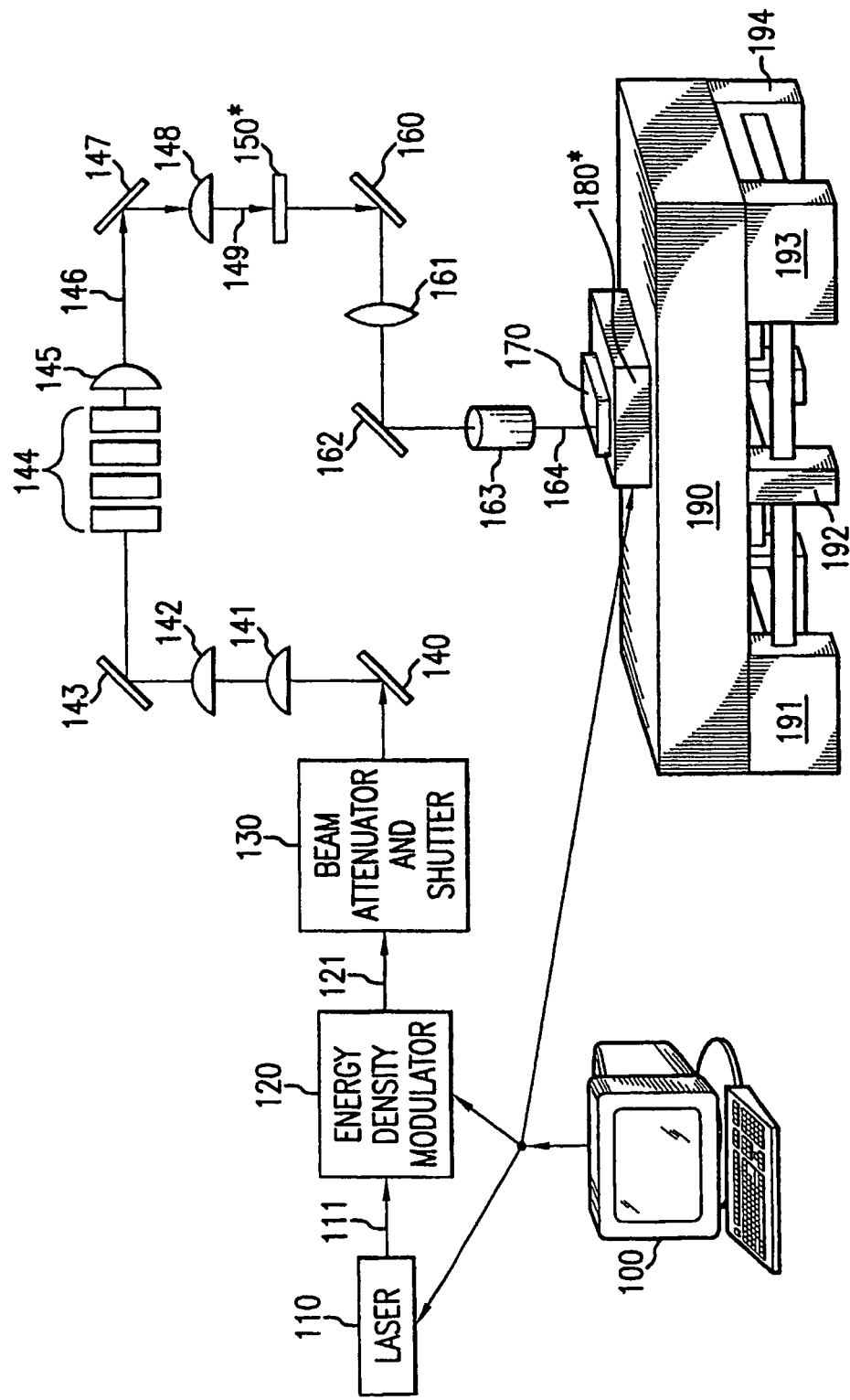
FIG. 1A is a schematic block diagram of an exemplary embodiment of an irradiation system according to the present invention which allows selected areas of a semiconductor thin film to be continuously scanned, at least partially melted and without re-irradiating these areas, in a predetermined controlled manner using a line-type beam.

Certain systems for providing a continuous motion SLS are described in U.S. patent application Ser. No. 09/526,585 (the "'585 application"), the entire disclosure of which is incorporated herein by reference. Substantially similar systems according to the exemplary embodiment of the present invention can be employed to generate at least partially irradiated, solidified and crystallized portions of the semiconductor film described above in which it is possible to process the entire semiconductor thin film in a controlled and accelerated manner with a line-type beam. In particular, the system according to the present invention can be used on a sample 170 which has an amorphous thin film (e.g., silicon) thereon that is irradiated by irradiation beam pulses to promote the melting, subsequent solidification and crystallization of the particular areas of the semiconductor thin film. As shown in FIG. 1A, the exemplary system includes a beam source 110 (e.g., a Lambda Physik model LPX-315I XeCl pulsed excimer laser) emitting an irradiation beam (e.g., a laser beam), a controllable beam energy density modulator 120 for modifying the energy density of the laser beam, a MicroLas two plate variable attenuator 130 (e.g., a device by MicroLas), beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), an eye piece 161, a controllable shutter, a multi-element objective lens 163 for focusing a radiation beam pulse 164 onto the sample 170 having the semiconductor thin film to be processed mounted on a sample translation stage 180, a granite block optical bench 190 supported on a vibration isolation and self-leveling system 191, 192, 193 and 194, and a computing arrangement 100 (e.g., a general purpose computer executing a computer program according to the present invention or a special-purpose computer) coupled to control the beam source 110, the beam energy density modulator 120, the variable attenuator 130, the shutter and the sample translation stage 180.

The sample translation stage 180 is preferably controlled by the computing arrangement 100 to effectuate translations of the sample 170 in the planar X-Y directions, as well as in the Z direction. In this manner, the computing arrangement 100 controls the relative position of the sample 170 with respect to the irradiation beam pulse 164. The repetition and the energy density of the irradiation beam pulse 164 are also controlled by the computing arrangement 100. It should be understood by those skilled in the art that instead of the beam source 110 (e.g., the pulsed excimer laser), the irradiation beam pulse can be generated by another known source of short energy pulses suitable for at least partially melting (and possibly fully melting throughout their entire thickness) selected areas of the semiconductor (e.g., silicon) thin film of the sample 170 in the manner described herein below. Such known source can be a pulsed solid state laser, a chopped continuous wave laser, a pulsed electron beam and a pulsed ion beam, etc. Typically, the radiation beam pulses generated by the beam source 110 provide a beam intensity in the range of 10 mJ/cm$^2$ to 1 J/cm$^2$, a pulse duration (FWHM) in the range of 10 to 300 nsec, and a pulse repetition rate in the range of 10 Hz to 300 Hz.

While the computing arrangement 100, in the exemplary embodiment of the system shown in FIG. 1A, controls translations of the sample 170 via the sample stage 180 for carrying out the processing of the semiconductor thin film of the sample 170 according to the present invention, the computing arrangement 100 may also be adapted to control the translations of the mask 150 and/or the beam source 110 mounted in an appropriate mask/laser beam translation stage (not shown for the simplicity of the depiction) to shift the intensity pattern of the irradiation beam pulses 164, with respect to the semiconductor thin film of the sample 170, along a controlled beam path. Another possible way to shift the intensity pattern of the irradiation beam pulse is to have the computing arrangement 100 control a beam steering mirror. The exemplary system of FIG. 1A may be used to carry out the processing of the semiconductor thin film of the sample 170 in the manner described below in further detail. The mask 150 can be used by the exemplary system of the present invention to well define the profile of the resulting masked beam pulse 164, and to reduce the non-uniformity of the adjacent portions and edge regions of the portions of the semiconductor thin film when these portions are irradiated by such masked beam pulse 164 and then crystallized.

Figure 1B:
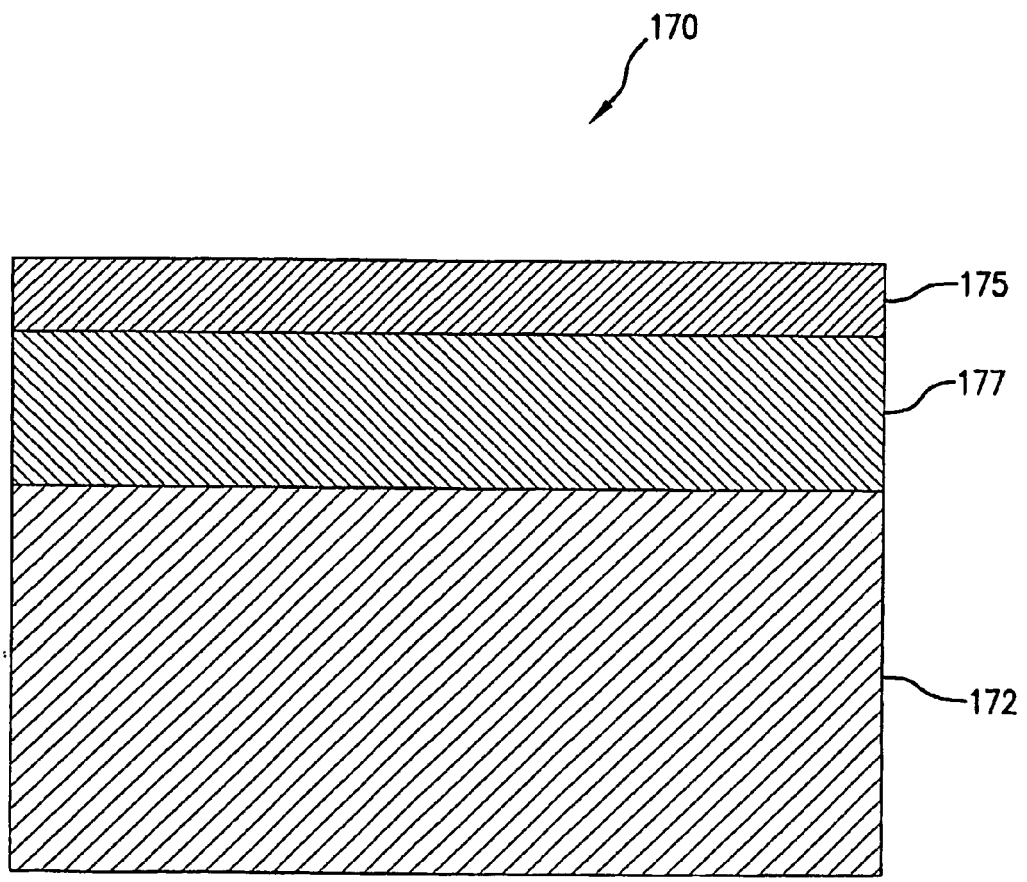
FIG. 1B is an enlarged cross-sectional side view of the sample which includes the semiconductor thin film.

As illustrated in FIG. 1B, a semiconductor thin film 175 of the sample 170 can be directly situated on, e.g., a glass substrate 172, and may be provided on one or more intermediate layers 177 there between. The semiconductor thin film 175 can have a thickness between 100 Å and 10,000 Å (1 μm) so long as at least certain necessary areas thereof can be at least partially or completely melted throughout their thickness. According to an exemplary embodiment of the present invention, the semiconductor thin film 175 (e.g., an amorphous silicon thin film) can be composed of silicon, germanium, silicon germanium (SeGe), etc. all of which preferably have low levels of impurities. It is also possible to utilize other elements or semiconductor materials for the semiconductor thin film 175. The intermediary layer 177, which is situated immediately underneath the semiconductor thin film 175, can be composed of silicon oxide ($SiO_2$), silicon nitride ($Si_3N_4$), and/or mixtures of oxide, nitride or other materials that are suitable for promoting grain growth within the designated areas of the semiconductor thin film 175 of the sample 170. The temperature of the glass substrate 172 can be between room temperature and 800° C. Higher temperatures of the glass substrate 172 can be accomplished by preheating the substrate 172 which would effectively allow larger grains to be grown in the irradiated, re-solidified, and then crystallized areas of the semiconductor thin film 175 of the sample 170 due to the proximity of the glass substrate 172 to the thin film 175.

The semiconductor thin film 175 can be irradiated by the beam pulse 164 which can be shaped using the mask 150 according to an exemplary embodiment of the present invention as shown in FIG. 2. The exemplary mask 150 is sized such that its cross-sectional area is preferably larger than that of the cross-sectional area of the beam pulse 164. In this manner, the mask 150 can pattern the pulsed beam to have a shape and profile directed by one or more open or transparent regions of the mask 150. The exemplary embodiment of the mask 150 shown in FIG. 2 includes an open or transparent region 157 that has a substantially long and narrow shape. This shape is defined by an opaque or beam-blocking region 155. The open or transparent region 157 (which may have a length L and a width A) permit beam pulses to irradiate there-through to at least partially melt the areas of the semiconductor thin film 175 that they impinge. Each of the beam pulses shaped by the mask 175 has a shape substantially corresponding to the shape of the open or transparent region 157.

Figure 3:
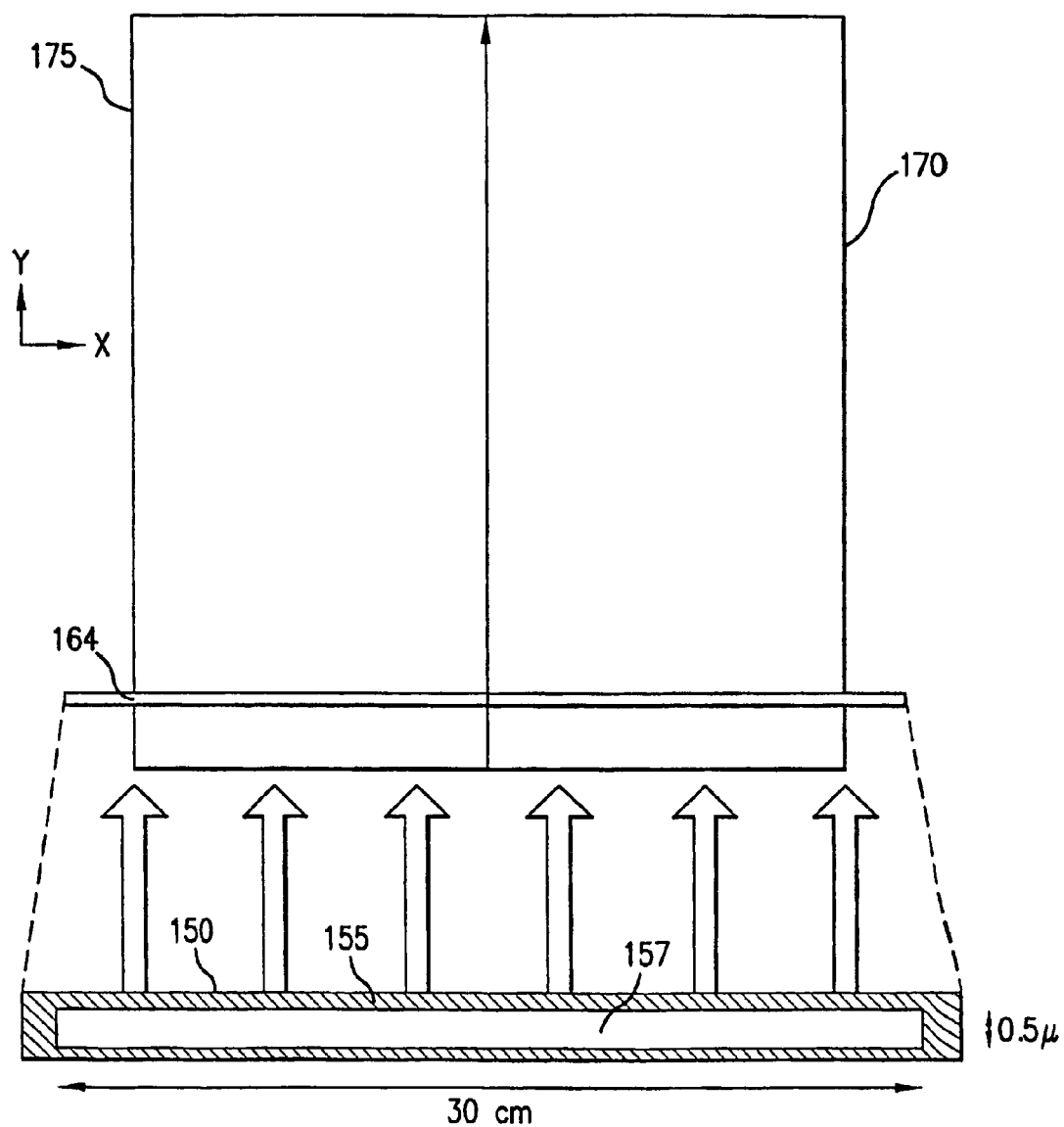
FIG. 3 is an exemplary illustration of a continuous-motion irradiation of the entire semiconductor thin film using the system of FIG. 1A and the mask of FIG. 2.
Figure 4A:
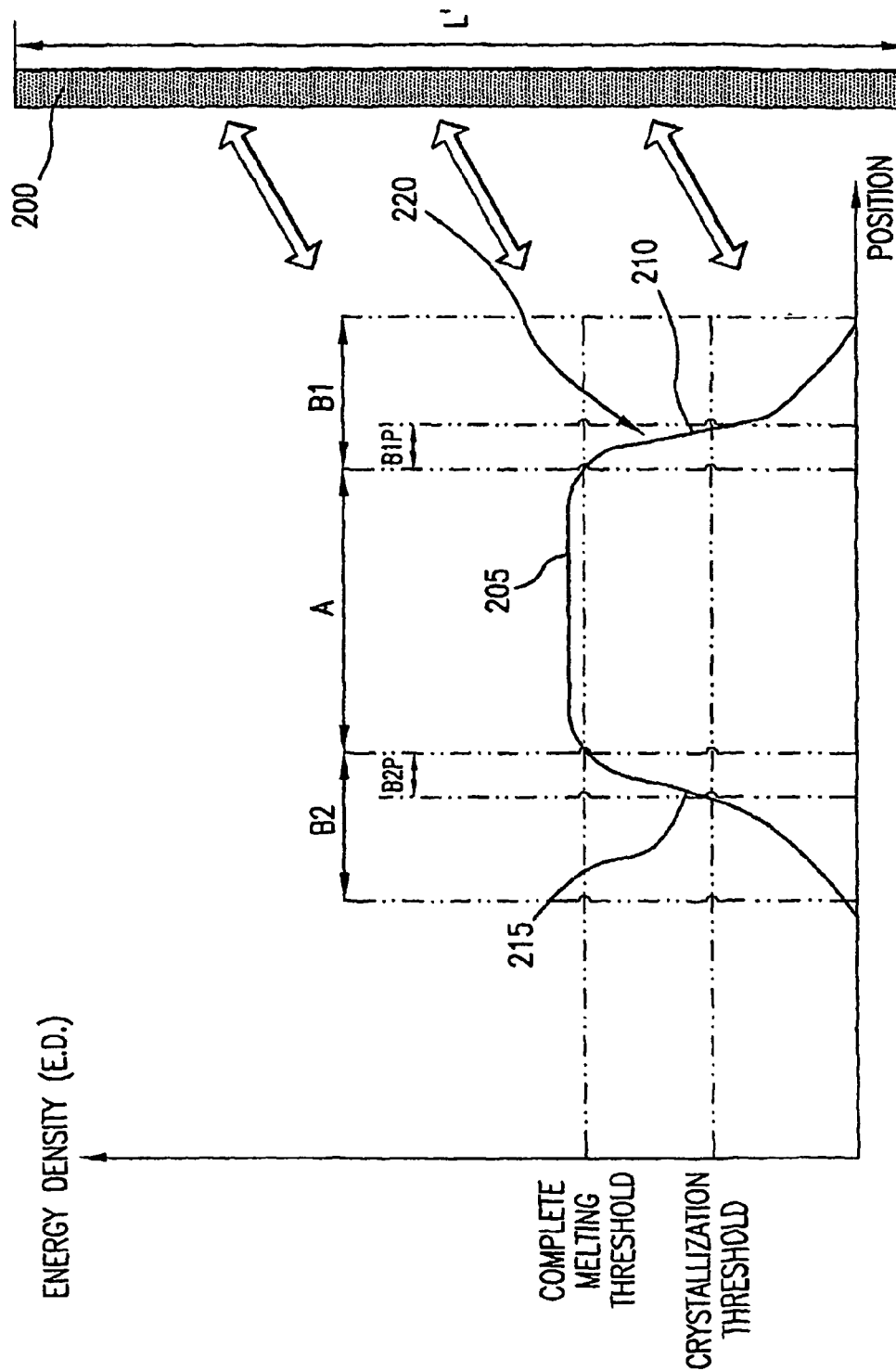
FIG. 4A is a cross-sectional profile of the line-type beam which can be shaped by optics of the system of FIG. 1A and/or patterned by the mask of FIG. 2, and may be used for irradiating the semiconductor thin film according to a first exemplary embodiment of the present invention which has energy density above the complete melting threshold.
Figure 4B:
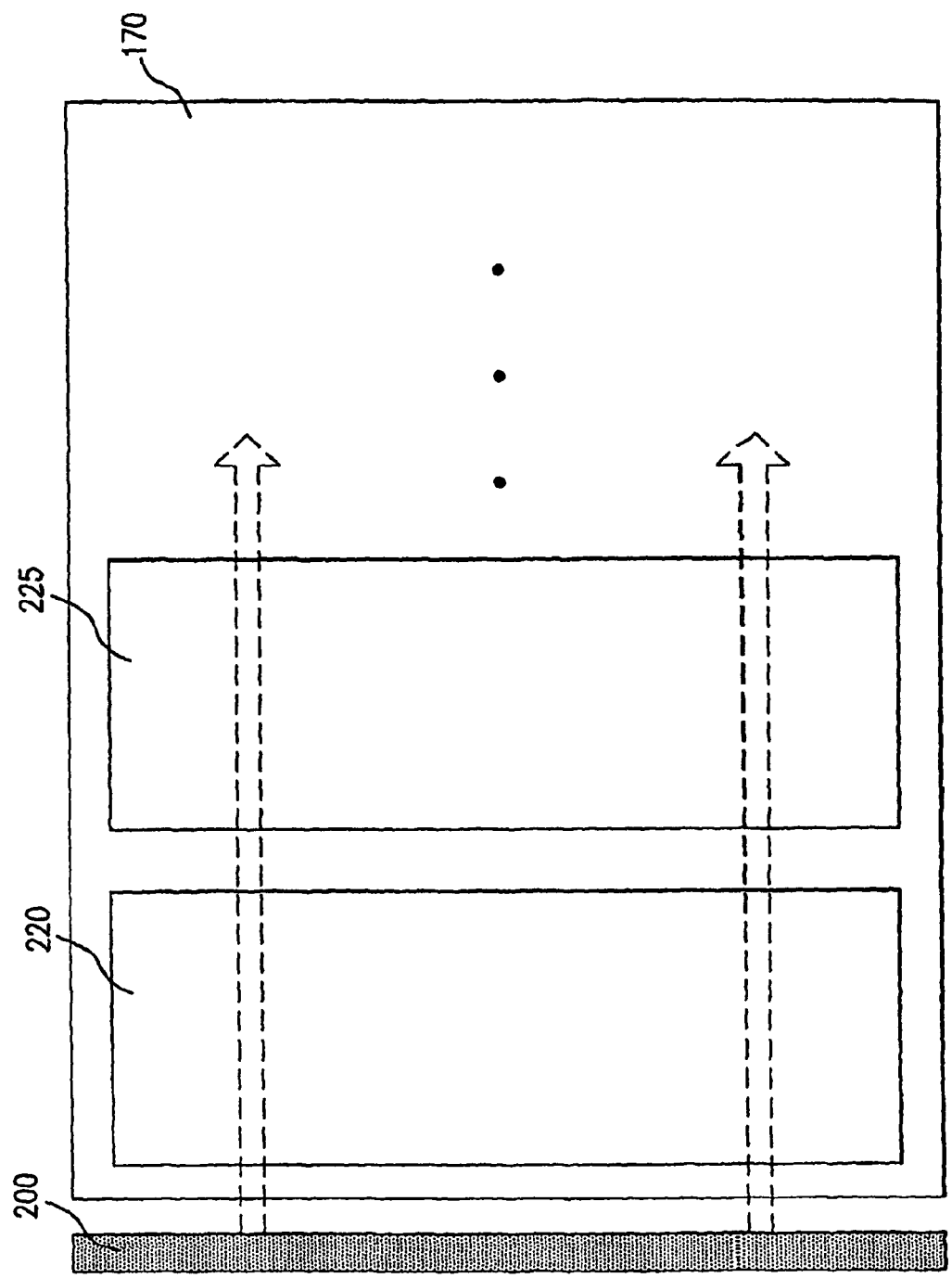
FIG. 4B is an illustration of a continuous scan processing of the semiconductor thin film using conventional systems, which re-irradiate previously irradiated areas or apply beams whose energy density is below a complete melting threshold.

An example of such beam pulse 200 is shown in FIG. 4A, which illustrates a first exemplary profile of the beam pulse, along with particular dimensions of sections thereof, which can be shaped by the optics of the system illustrated in FIG. 1A and/or produced by the mask 150 of FIG. 2. In particular, the shaped-beam pulse 200 may have a particular width W' (e.g., 300 μm to 1.2 mm) and a particular length L' (e.g. 10 cm to 50 cm), both of which relating to the length L and the width W of the open/transparent region 157 of the mask 150. In this manner, the beam pulse 200 thus produced by, e.g., the mask 150 extends for the length L to preferably process the entire length of the thin film sample 175. The entire sample 170 can be irradiated by the beam pulses 200 of the beam 164 as shown in FIG. 3, and described in further detail below. The profile 220 of the beam pulse 200 includes a top portion 205, a leading edge portion 210 and a trailing edge portion 215, all of which can extend for a particular distance. The top portion 205 may extends for a distance A within which the energy density is at or above the complete melting threshold. This distance A can be between 200 μm to 1 mm. The leading edge portion 210 can extend for a distance B1 (e.g., between 50 μm and 100 μm), and the trailing edge portion 215 may extend for a distance B2 (e.g., also between 50 μm and 100 μm). The leading edge portion 210 has a section with a length of B1P, which extends from the point of the crystallization threshold to the point of the complete melting threshold, and which can be approximately half the size of the length B1. Similarly, the trailing edge portion 215 has a section with a length of B2P which extends from the point of the crystallization threshold to the point of the complete melting threshold, and which can be approximately half the size of the length B2.

Figure 4C:
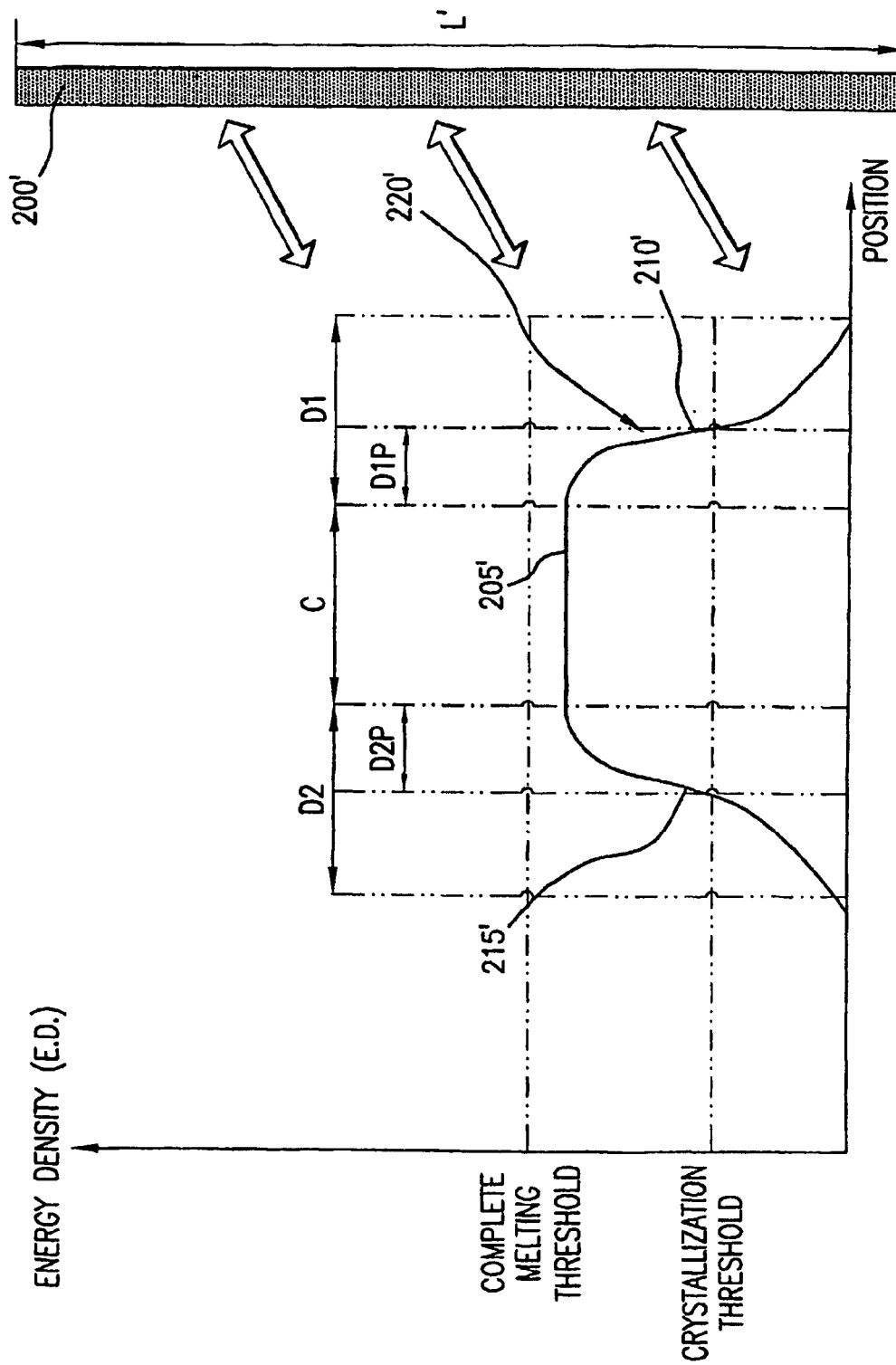
FIG. 4C is a cross-sectional profile of the line-type beam according to a second exemplary embodiment of the present invention which has energy density above the crystallization threshold and below the complete melting threshold.
Figure 5:
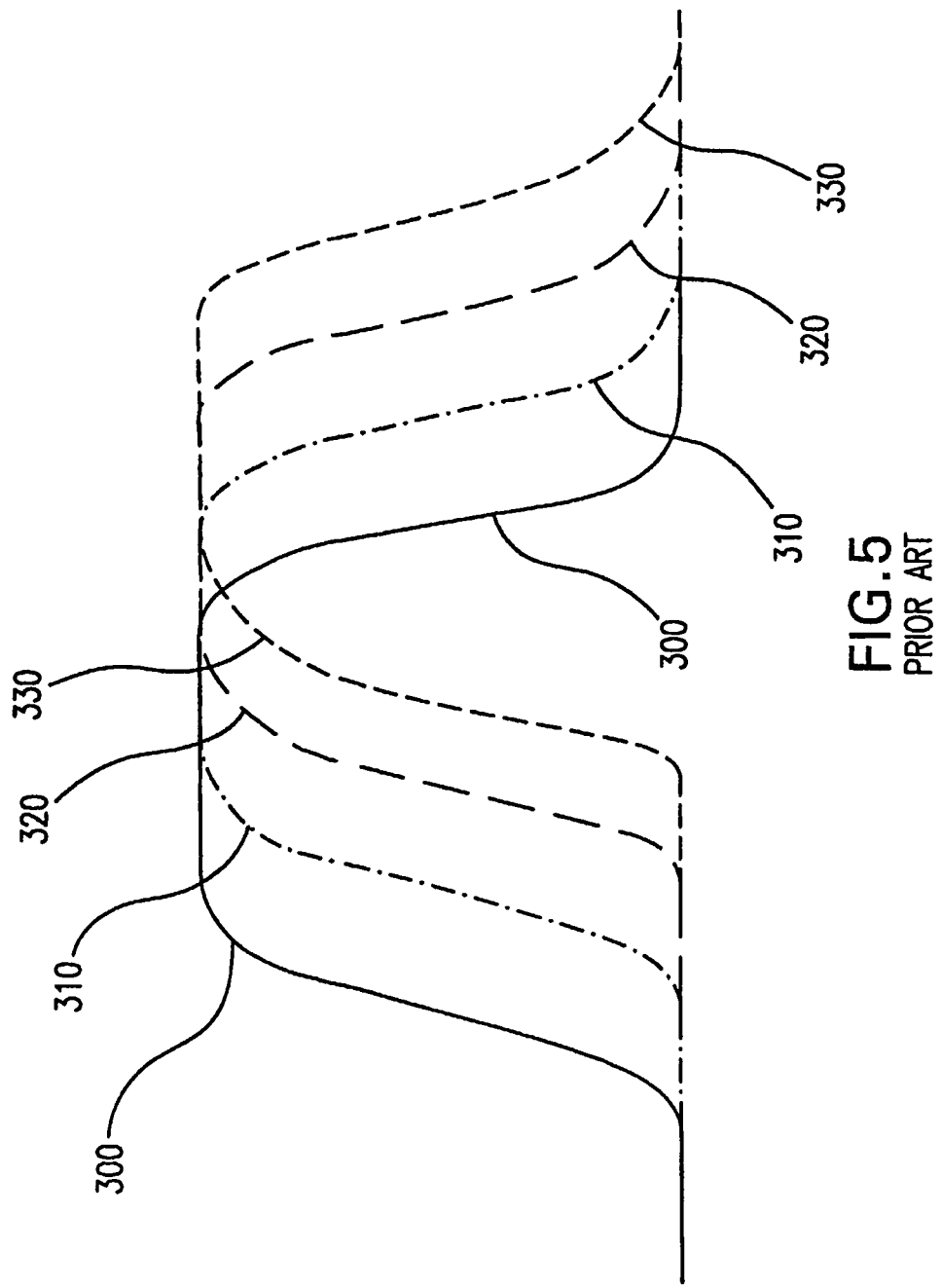
FIG. 5 is an illustration of profiles of multiple line-type beams which re-irradiate previously irradiated portions of the semiconductor thin film.
Figure 6A:
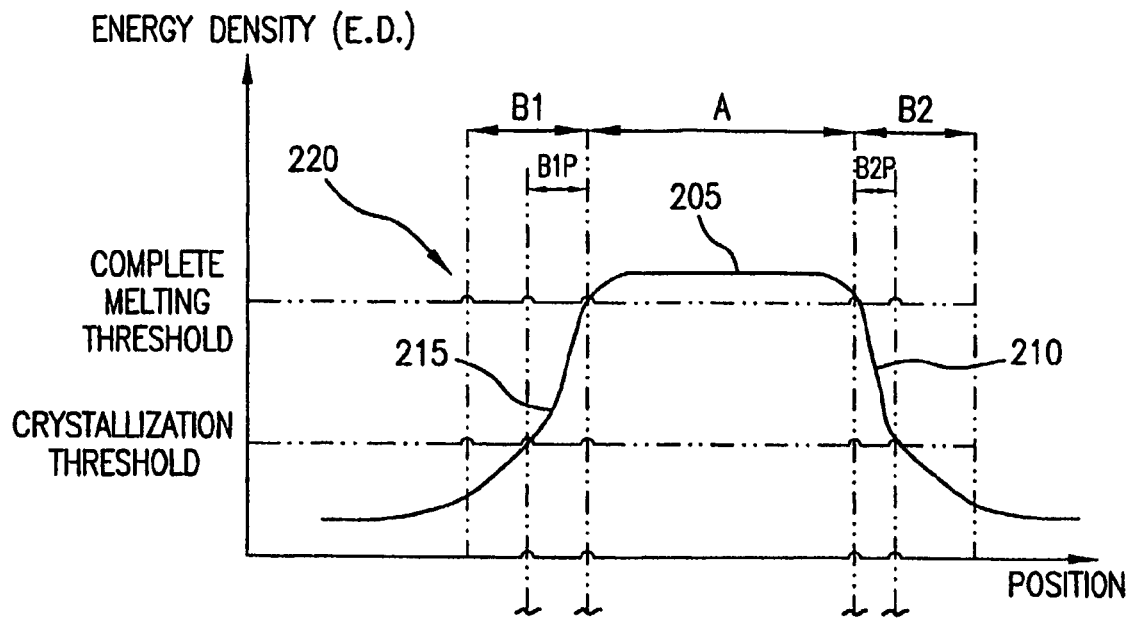
FIGS. 6A and 6B are examples of the results of irradiations of the conventional systems and methods when utilizing line-type beams whose energy densities are above the complete melting threshold.
Figure 6B:
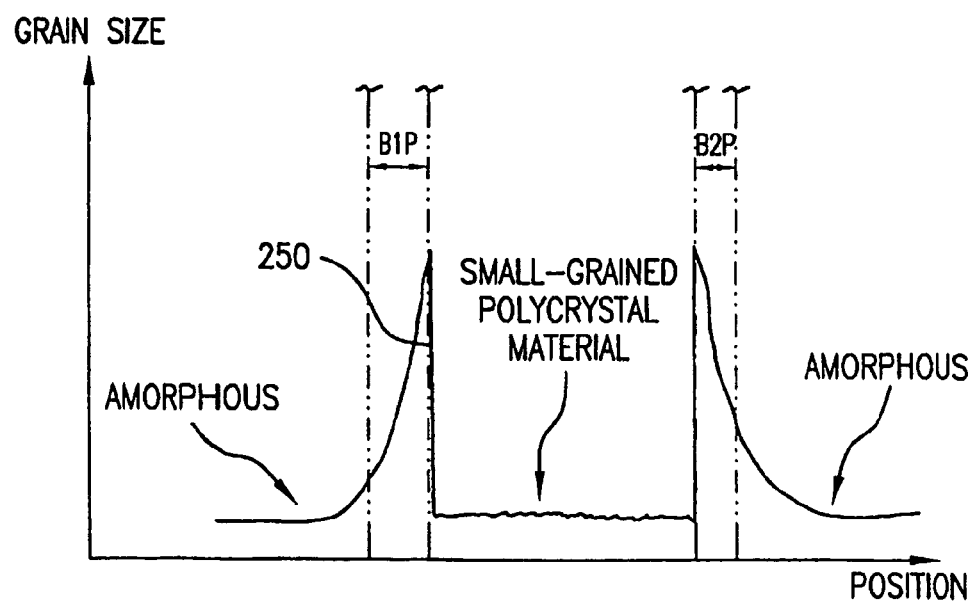
Figure 6C:
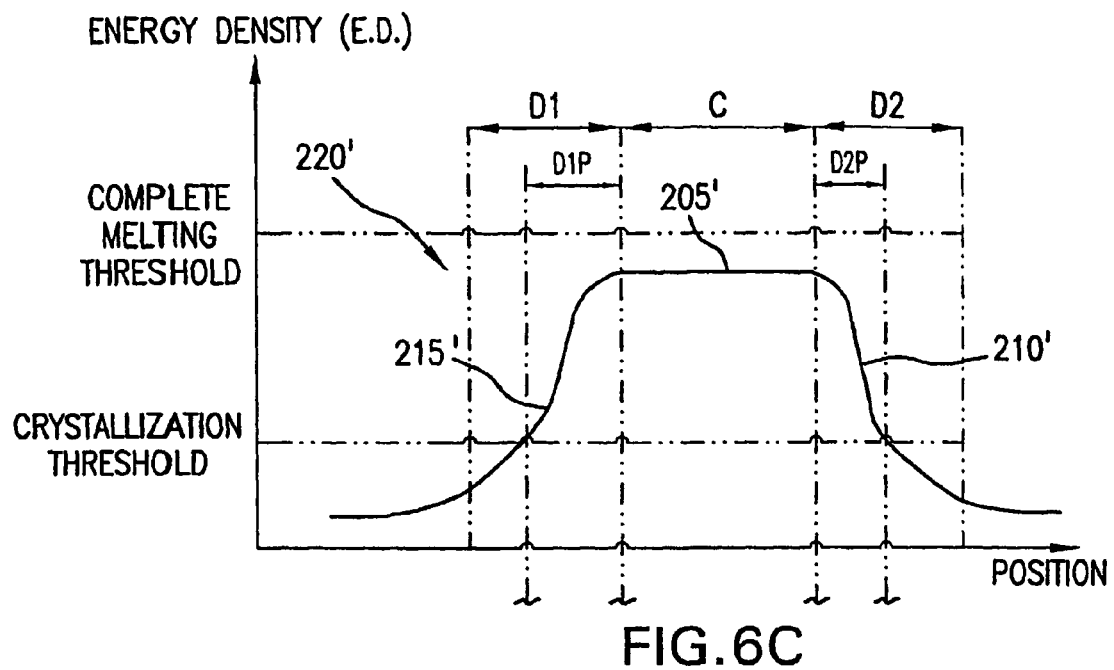
FIGS. 6C and 6D are examples of the results of irradiations of the conventional systems and methods when utilizing line-type beams whose energy densities are between the crystallization threshold and the complete melting threshold.
Figure 6D:
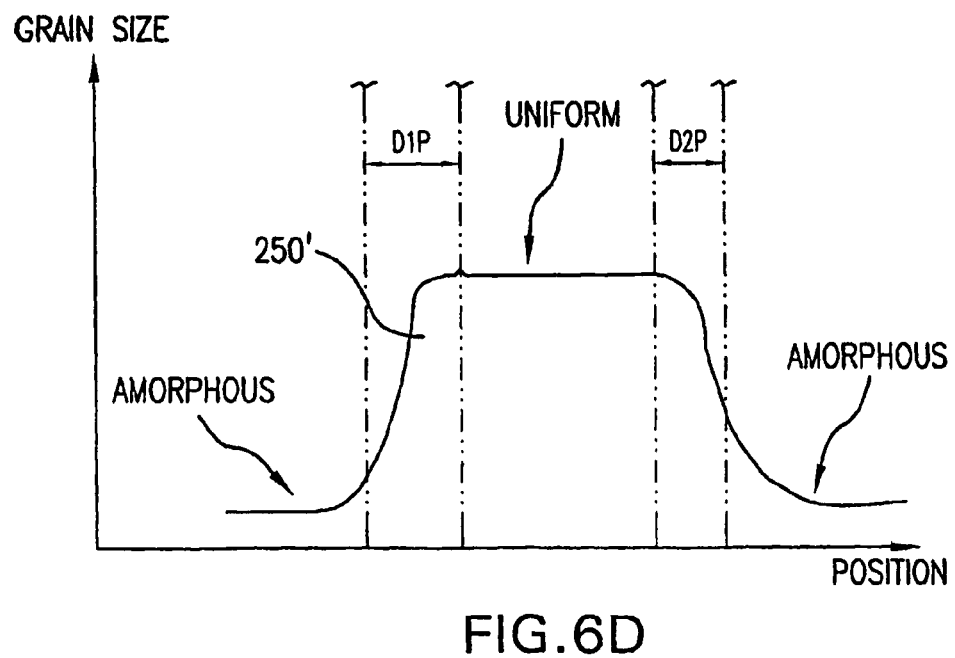

A second exemplary profile of the beam pulse 200 is illustrated in FIG. 4C, which can also be shaped by the optics of the system illustrated in FIG. 1A and/or produced by the mask 150 of FIG. 2. In this second exemplary embodiment, the energy density of the beam pulse 200 has a profile 220' with an energy density that is below the complete melting threshold. In particular, this profile 220' includes a top portion 205', a leading edge portion 210' and a trailing edge portion 215'. The top portion 205' of this embodiment extends for a distance C, within which the energy density is approximately constant. The distance C may be between 200 μm to 1 mm. The leading edge portion 210' can extend for a distance D1 (e.g., between 501 μm and 100 μm), and the trailing edge portion 215' may extend for a distance D2 (e.g., also between 50 μm and 100 μm). The leading edge portion 210' has a section with a length of DIP, which extends from to the point when the energy density is approximately constant to a lower point of the crystallization threshold. Similarly, the trailing edge portion 215' has a section with a length of D2P which extends from the point of the crystallization threshold to a higher point of when the energy density is approximately constant.

As shown in FIG. 3, according to an exemplary embodiment of the present invention, the pulses 200 of the line-type beam 164 irradiate all rows of the thin film 175 provided on the semiconductor sample 170 in a controlled manner. For example, the computing arrangement 100 controls the beam source 110 to emit an initial beam so that the beam 164 (either masked by the mask 150 or shaped by the optics of the system) irradiates each row of the semiconductor thin film 175 provided on the sample 170 by translating the stage 180 on which the sample 170 is situated based on the location of the rows of the sample 170, i.e., relative to the direction of the line-type beam 164. In particular, the computing arrangement 100 has a memory arrangement (not shown) which has stored thereon the location of each of the rows of the semiconductor thin film 175 which are to be irradiated by the beam pulse 200. Therefore, the relative motion of the sample 170 with respect to the line-type beam 164 and the actuation of the beam source 110 are performed based on the locations of these rows. Such irradiation of the semiconductor thin film 175 by the line-type beam 164 is continued until all rows of the semiconductor thin film 175 provided on the sample 170 are irradiated by the line-type beam pulses 200 so that they re-solidify and form uniform-grained material areas. According to a preferred embodiment of the present invention, at least the areas in the rows of the semiconductor thin film 175 which are intended to situate microstructures (e.g., TFTs) thereon are preferably irradiated with the top portion 205 of the pulse 200 and fully melted so that these areas (e.g., pixels) can preferably be irradiated once by the convex top portion 205 of the pulse 200 shown in FIG. 4A. It is also possible to irradiate the semiconductor thin film 175 using the top portion 205' of the pulse 200 illustrated in FIG. 4C. In this exemplary embodiment, the top portion 205' has the energy density that is below the complete melting threshold of the thin film 175, thereby only partially melting the thin film 175. Of course, sections of the leading and trailing portions 210, 215 of the embodiment of FIG. 4A and the portion 210', 215' of the embodiment shown in FIG. 4C can also irradiate the semiconductor thin film 175 in a similar manner, with certain limitations as shall be described in further detail below.

Figure 7:
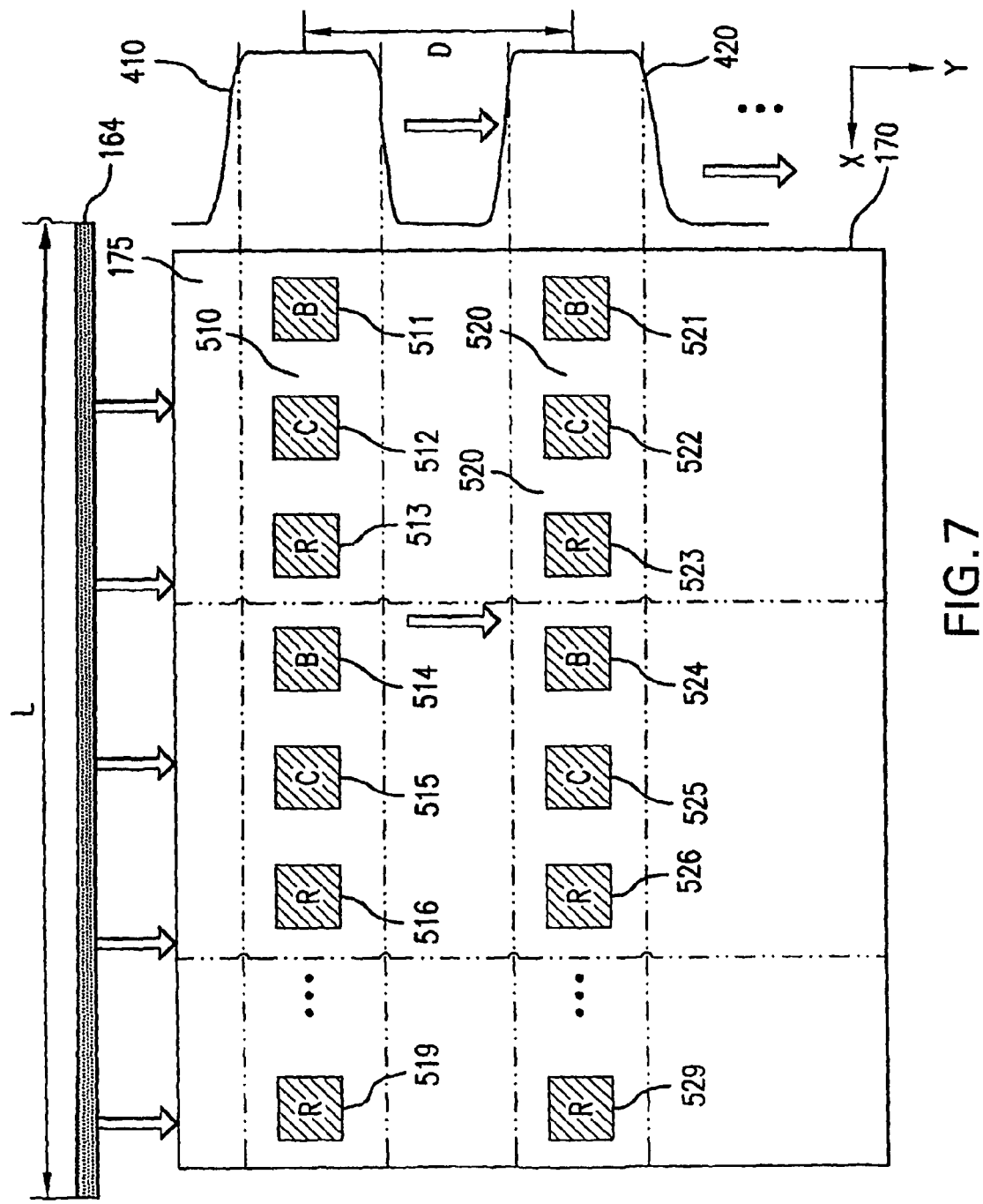
FIG. 7 is an exemplary illustration of sequential movements of the semiconductor film of a sample with respect to the pulses of the line-type beam shaped by the optics of the system of FIG. 1A or patterned by the mask of FIG. 2 according to an exemplary embodiment of the present invention.

FIG. 7 illustrates sequential translations of the thin film 175 of the sample 170 with respect to the pulses 200 of the line-type beam 164 shaped by the optics of the system of FIG. 1A and/or patterned by the mask of FIG. 2 according to an exemplary embodiment of the present invention. In this exemplary illustration of the irradiation of the semiconductor thin film 175 provided on the sample 170, the sample 170 is translated in a −Y direction with respect to the direction of the line-type beam 164. When the sample 170 is translated in this manner to a position such that the line-type beam 164 points at a first row 510 of the thin film 175, the beam source 110 is actuated by the computing arrangement 100 so that a first line-type beam pulse 410 irradiates and at least partially melts, using a beam pulse 200 as depicted in FIG. 4C, or preferably fully melts, using a beam pulse 200 as described in FIG. 4A, one or more portions 511-519 at the first row 510 of the semiconductor thin film 175. The profile and length of the first line-type pulse 410 shown in FIG. 7 substantially corresponds to the profile and length of the pulse 200 illustrated in FIG. 4A. It is preferable for the width A of the convex top portion 205 of the first pulse 410 to be wide enough to irradiate and completely melt the entire cross-sections of the portions 511-519. These portions can be designated to place certain structures (e.g., TFTs) therein so that they can be used to define the pixels. The resolidified portions which are partially melted would likely possess smaller crystallized-grain regions, but include uniform material therein.

Upon the irradiation and at least partial melting of such portions 511-519 using the top portion 205 of the profile 220' of the embodiment shown in FIG. 4C in the first row 510 of the semiconductor thin film 175 as described above, the melted portions 511-519 resolidify and crystallize so that they have uniform crystal grain growth therein. According to another exemplary embodiment of the present invention and also as mentioned above, the line-type beam 164 may have enough energy density to fully melt (throughout its thickness) the entire row 510 of the thin film 175, or at least the portions 511-519 thereof using the top portion 205 of the profile 220 of the embodiment shown in FIG. 4A. Such fully melted and re-solidified portions of the thin film 175 would have crystal-grains provided therein, which generally do not depend on the sensitivity of the fluence of the line-type beam 164. In this manner, the negative effects of the energy density fluctuations of the of the line-type beam 164 on the uniformity of the resulting TFT devices provided in such re-solidified areas are minimized.

After the first row 510 is irradiated and either partially or fully melted using the line-type pulse 410 as described above, the sample 170 is translated in the −Y direction (via a control of the computing arrangement 100) so that the beam 164 impinges on a second row 520 of the semiconductor thin film 175 provided on the sample 170. As for the first row 510 and upon reaching the second row 520, the beam source 110 is actuated by the computing arrangement 100 to generate a second line-type pulse 420 which irradiates and either at least partially or fully melts one or more sections 521-529 of the second row 520 in substantially the same manner as described above with respect to the irradiation of the first row 510. This translation of the sample 170 (so that the impingement of the line-type beam 164 moves from the first row 510 to the second row 520 of the semiconductor thin film 175) is executed for a distance D. The distance D can be also referred to a pixel row periodicity since the translation of the sample 170 via the distance D is performed for other rows of the sample 170.

It is preferable for this distance D to be pre-assigned such that the trailing portion 215' of the second line-type pulse 520 does not overlap the leading portion 210' of the first line-type pulse 510. For example, the distance D can be measured from a center of the top portion 205' of the first pulse 410 to a center of the top portion 205' of the second pulse 420. It is possible, however, to have certain sections of the trailing portion 215' of the second line-type pulse 520 and of the leading portion 210 of the first line-type pulse 510 overlap one another. Such portions would preferably possess only the energy densities that are smaller than the crystallization threshold value. Thus, preferably, no portion of the subsequent pulse 200 of the profile 220' should overlap the section of the thin film 175 irradiated by the top portion 205' of the preceding pulse 200 of such profile for the exemplary embodiment of FIG. 4C.

This is because the flat top portion 205' partially melts the thin film 175, and generates grains of uniform size in such irradiated areas.

If any subsequent irradiation on this irradiated section takes place, uniformity of this area may be compromised. Similarly, if the beam pulse 200 having the profile 220 of FIG. 4A is utilized, then similar translation distance considerations exist, except that none of the portions of the profile 220 of the subsequent beam pulse 200 should overlap the section of the film sample 175 that was irradiated by the top portion 205 of the previous beam pulse 200. However, contrary to the use of the beam pulse 200 of the embodiment of FIG. 4C, the energy density of the top portion 205 is above the complete melting threshold, and thus no portion of the subsequent beam pulse should overlap the completely melted previously section of the thin film 175 so as to avoid non-uniformity of such overlapped section due to the reirradiation thereof.

The sample 170 can then again be translated for the distance D in the same manner as described above with respect to the translation of the sample 164 so as to irradiate the second row 520 of the semiconductor thin film 175. Upon such translation, the line-type beam 164 impinges the third row of the thin film 175, and irradiates and partially melts one or more portions thereof.

Thus, for the embodiment of FIG. 4A, the width B1 of the leading portion 210 (or width B1P) plus the width B2 of the trailing portion 215 (or width B2P) should be smaller than the distance D. In this manner, the leading portion 210 of the second line-type pulse 410 and the trailing portion 215 of the second line-type pulse 420 would not overlap. For the embodiment of FIG. 4C, in a similar manner, the width D1 of the leading portion 210' (or width D1P) and the width D2 of the trailing portion 215' (or width D2P) should both be smaller than the distance D.

According to one exemplary embodiment of the present invention, the translation of the sample 170 with respect to the impingement thereof by the beam 164 is performed continuously (e.g., without stopping). The computing arrangement 100 can control the beam source 110 to generate the corresponding pulses 200 based on a predefined frequency. In this manner, it is possible to define the velocity V of the continuous translation of the sample 170 with respect to the impingement of the semiconductor thin film 175 by the line-type pulses 410, 420, so that the respective rows 510, 520 of the thin film 175 are accurately irradiated by the pulses. For example, this velocity V of the translation of the sample 170 can be defined as follows:

$$V = D \times f_{laser}$$

where $f_{laser}$ is the frequency of the laser. Thus, if the distance D is 200 μm and the $f_{laser}$ is 300 Hz, the velocity V can be approximately 6 cm/sec, which can be a constant velocity.

According to another embodiment of the present invention, while the sample 170 does not have to be continuously translated with respect to the impingement thereof by the beam 164, the actuation of the beam source 110 can be controlled based on a positional signal provided by the translation stage 180. This signal may indicate the position of the sample 170 relative to the position of the impingement thereof by the line-type beam 164. Based on the data associated with such signal, the computing arrangement 100 can direct the actuation of the beam source 110 and the translation to the sample 170 to achieve an effective irradiation of specific portions (e.g., rows) of the semiconductor thin film 170. Thus, the location controlled irradiation of at least portions of the semiconductor thin film 175 can be achieved using a line-type beam 164.

The description above for the line-type beam 164 has been directed to a Gaussian-shaped beam pulse, the examples of which is illustrated in FIGS. 4A and 4C. According to yet another exemplary embodiment of the present invention, it is also possible to utilize a top-hat line-type beam 250, the exemplary profile of which is illustrated in FIG. 8. In particular, this line-type beam 250 has the energy density, which is greater than the complete melting threshold of the semiconductor thin film 175. It should be understood that the energy density of this beam 250 can also be greater than or equal to the crystallization threshold of the semiconductor thin film 175 or above the complete melting threshold. As shown in FIG. 8, the top hat line-type beam 250 generally does not have any leading or trailing portions, and thus the distance D of the translation of the sample 170 does not have to be as great as would be preferable for the Gaussian-type beam. The top-hat line-type beam 250 can be generated using a mask that has a knife edge aperture such that the beam source 110 provides a laser beam, which is then shaped by such a mask.

Figure 9A:
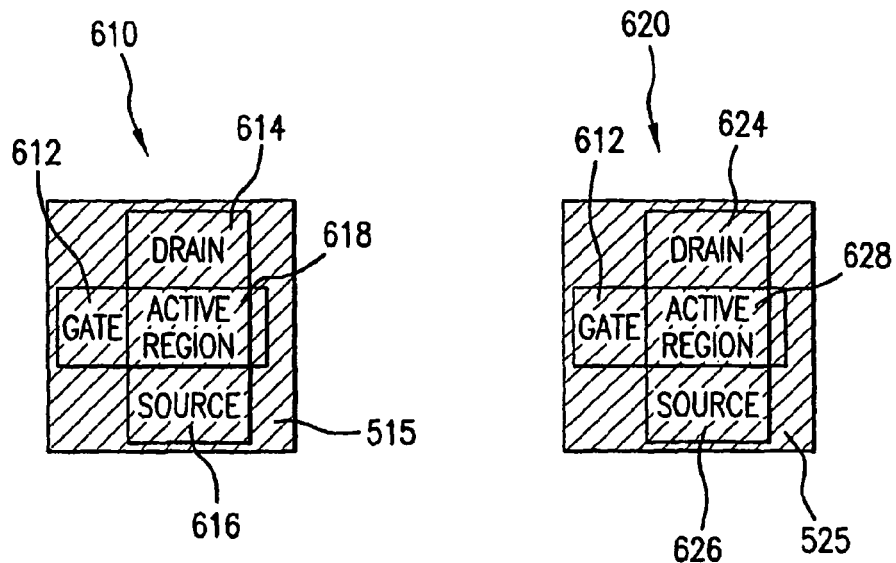
FIG. 9A is an illustration of the two particular areas irradiated, re-solidified and crystallized areas corresponding to the areas of FIG. 7 in which the entire TFT device is situated on the small uniformed grained region formed through complete melting and re-solidification according to the present invention.

FIG. 9A shows an illustration of exemplary first and second irradiated, re-solidified and crystallized portions 511 and 512 of the first row 510 of the semiconductor thin film 175 illustrated in FIG. 7. In particular, FIG. 9A shows that the entire TFT devices 610, 620 can be situated within the respective first and second portions 511, 512 of the first row 510. The first TFT device 610 situated in the first portion 511 of the first row 510 includes a gate 612, a drain 614, a source 616 and an active region 618. Similarly, the second TFT device 620 includes a gate 622, a drain 624, a source 626 and an active region 628.

Figure 9B:
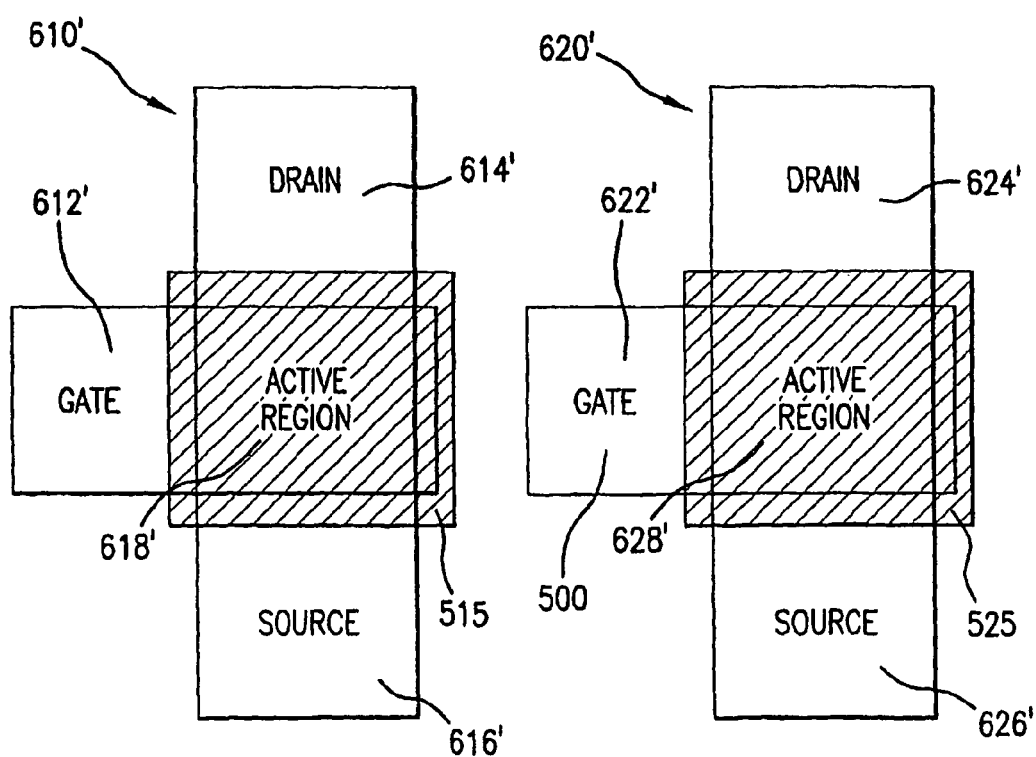
FIG. 9B is an illustration of the two particular areas irradiated, re-solidified and crystallized areas corresponding to the areas of FIG. 7 in which only the entire cross-section of the active region of the TFT device is situated in the small uniformed grained region formed through nucleation, while other regions are provided over border areas between the crystallized areas.

FIG. 9B shows an another exemplary illustration of the first and second irradiated, re-solidified and crystallized portions 511 and 512 of the first row 510 of the semiconductor thin film 175, with the respective TFT devices 610', 620' provided thereon. In this exemplary embodiment, only respective active regions 618', 628' of the TFT devices 610', 620' are provided within the respective first and second crystallized portions 511, 512, while other portions of the TFT devices 610', 620' are situated on the borders of the these portions 511, 512. In particular, the first TFT device 610' includes an active region 618' which entirely situated in the first portion 511 of the first row 510, while a gate 612', a drain 614' and a source 616' of this TFT device 610' overlap the borders of the first portion 511. Also, for the second TFT device 610', an active region 628' thereof is entirely situated within the respective second portion 512 of the first row 510, while a gate 622', a drain 624' and a source 626' of the second TFT device 620' are provided directly on the borders of such second portion 512. It should be understood that any one of the gate 612, 612', 622, 622', drain 614, 614', 624, 624' and source 616, 616', 626, 626' can be provided on the first and second areas 511, 512 and the border regions thereof.

It should be understood that the above description is equally applicable for all portions 511-519, 521-529, etc. of the semiconductor thin film 175. In addition, the above placement of the active regions 618, 628, 618', 628' within the portions 511-19, 521-529, etc. is possible due to the uniformity achieved using the exemplary system and process according to the present invention described herein.

Figure 10:
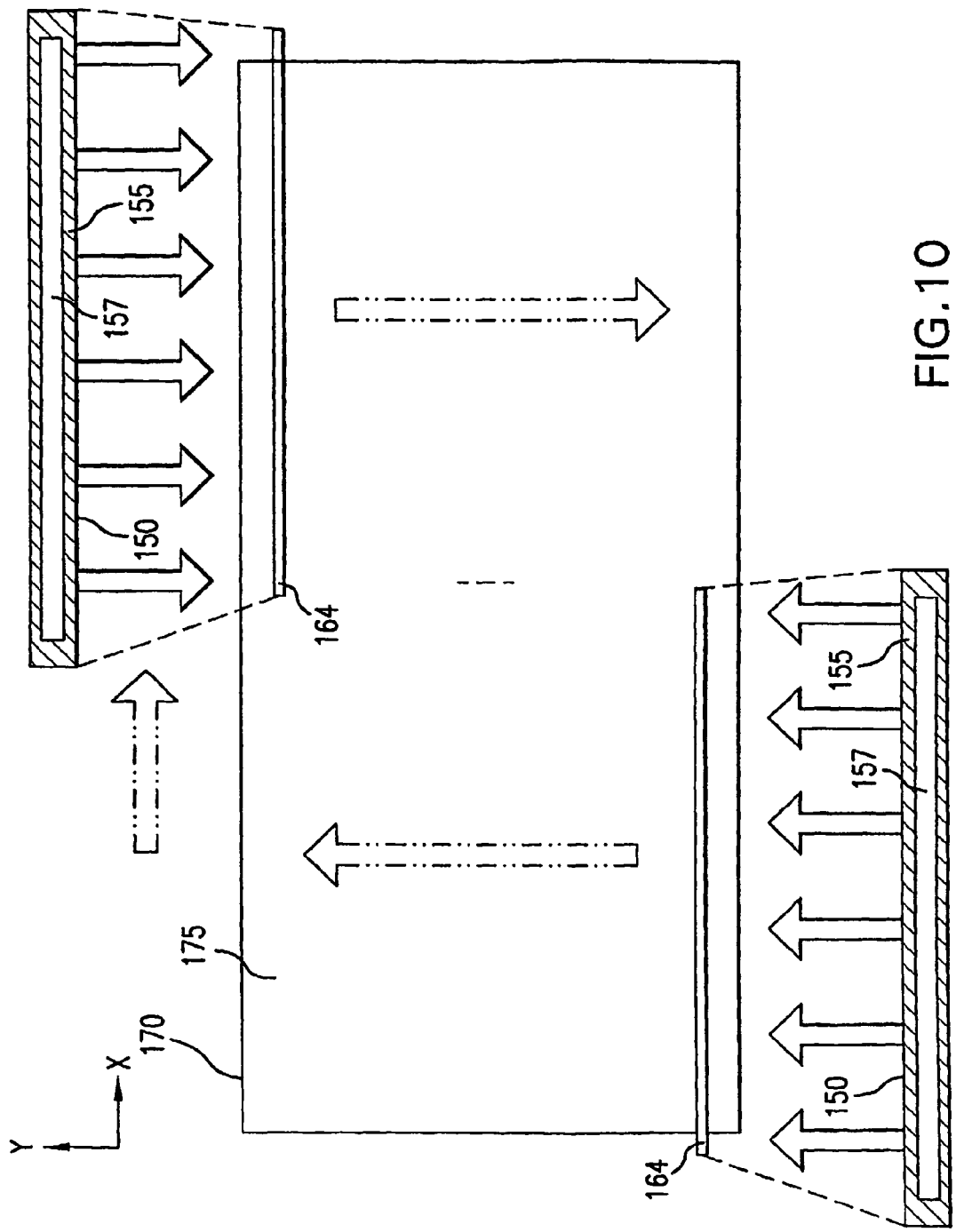
FIG. 10 is another exemplary illustration of sequential movements of the semiconductor film of the sample with respect to the pulses of the line-type beam shaped by the optics of the system of FIG. 1A or patterned by the mask of FIG. 2 according to another exemplary embodiment of the present invention, in which the entire sample is irradiated in two passes.

FIG. 10 shows another exemplary illustration of sequential movements of the sample 170 by the translation stage 180 with respect to the impingement of the pulses of the line-type beam shaped by the optics of the system of FIG. 1A or patterned by the mask of FIG. 2. In this exemplary embodiment, the relative translation of the sample 170 with respect to the impingement by the line-type pulses 410, 420 are substantially similar to the relative translation of the sample described above with reference to FIG. 3. However, the length of the line-type beam 164 in this embodiment is approximately half the length L of the embodiment of the line-type beam 164 of FIG. 3. For example, the profile of the line-type beam 164 shown in FIG. 10 can be 15 cm, irradiating the sample 170 which has a width which is smaller than 30 cm. Accordingly, using such beam length, the entire sample 170 is irradiated in two passes. In particular, one half of the sample 170 is irradiated in the manner described above with reference to FIG. 7 by, e.g., irradiating such half section of the sample 170 while translating the sample 170 in the −Y direction. When the impingement of the line-type beam 164 completes the irradiation of the entire half section of the sample 170 (i.e., reaches an opposite edge from which the irradiation began), the sample 170 is translated in the −X direction, and second half section of the sample 170 is irradiated while translating the sample 175 in the +Y direction. Thus, the entire sample 170 can be irradiated by the line-type beam 164 in two passes. It is also within the scope of the present invention to use the line-type beams which have shorter lengths, so that a larger number of passes are performed to completely process the sample 170.

Figure 11:
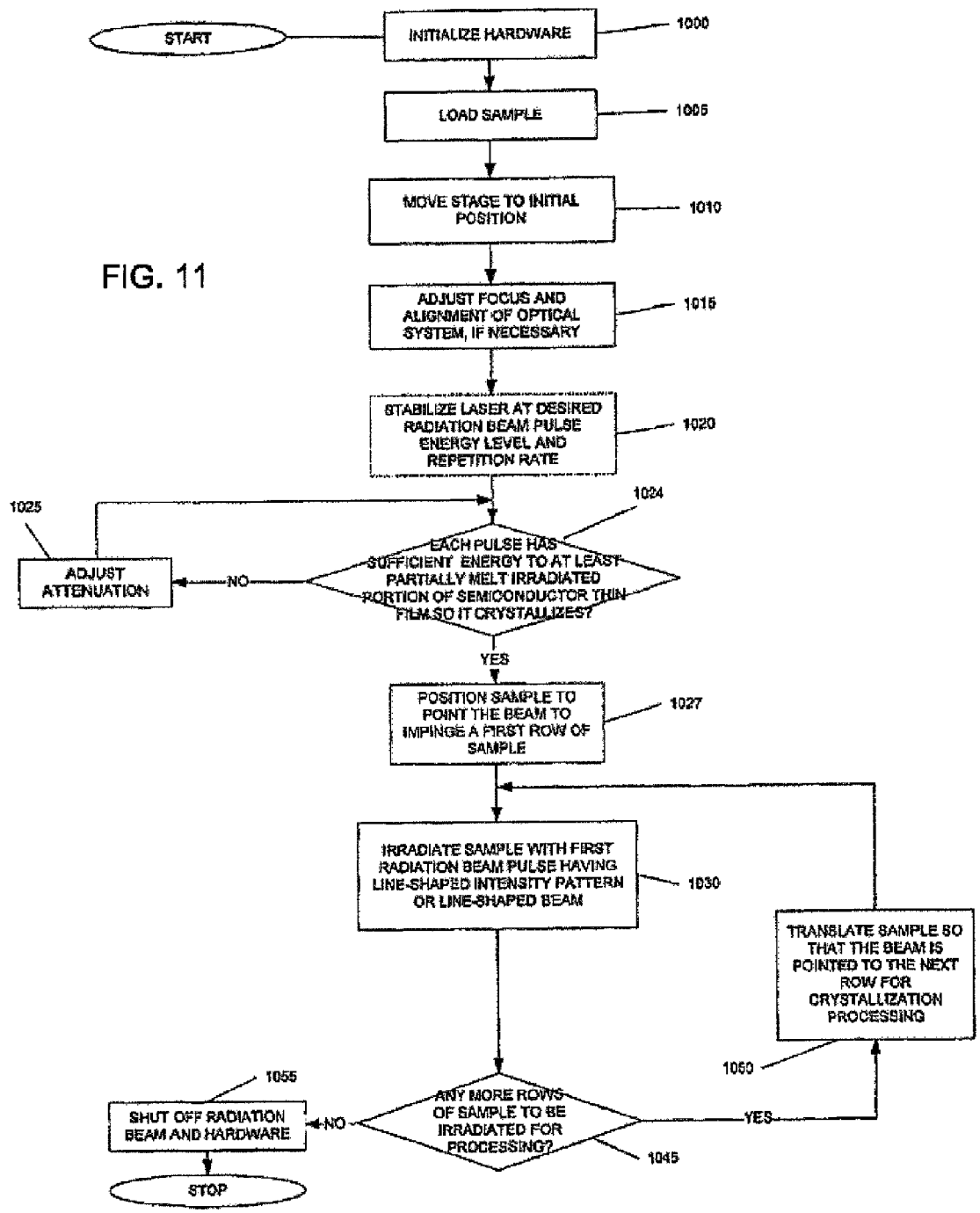
FIG. 11 is a flow diagram representing an exemplary processing procedure of the present invention under at least partial control of a computing arrangement of FIG. 1A using the exemplary techniques of the present invention of FIGS. 7 and 10.

FIG. 11 shows a flow diagram representing an exemplary processing procedure of the present invention under at least partial control of the computing/processing arrangement 100 of FIG. 1A using the exemplary techniques of the present invention provided in FIGS. 7 and 10. In step 1000, the hardware components of the system of FIG. 1A, such as the beam source 110, the energy beam modulator 120, and the beam attenuator and shutter 130 are first initialized at least in part by the computing arrangement 100. The sample 170 is loaded onto the sample translation stage 180 in step 1005. It should be noted that such loading may be performed either manually or automatically using known sample loading apparatus under the control of the computing arrangement 100. Next, the sample translation stage 180 is moved, preferably under the control of the computing arrangement 100, to an initial position in step 1010.

Various other optical components of the system are adjusted and/or aligned either manually or under the control of the computing arrangement 100 for a proper focus and alignment in step 1015, if necessary. In step 1020, the irradiation/laser beam 111 is stabilized at a predetermined pulse energy level, pulse duration and repetition rate. In step 1024, it is preferably determined whether each beam pulse 164 has sufficient energy to at least partially melt (and preferably fully melt) the irradiated portions of the semiconductor thin film 175 without overheating. If that is not the case, the attenuation of the beam 111 is adjusted by the beams source 110 under the control of the computing arrangement 100 in step 1025, and step 1024 is executed again to determine if the there is sufficient energy to at least partially melt the portions of the semiconductor thin film 175.

In step 1027, the sample 170 is positioned to point the pulse 410 of the line-type beam 164 to impinge the first row 510 of the semiconductor thin film 175. Then, in step 1030, the respective row of the semiconductor thin film 175 is irradiated and at least partially melted using a masked intensity pattern (e.g., using the mask 150 illustrated in FIG. 2). Thereafter, the irradiated row (and/or portions thereof) of the semiconductor thin film 175 are allowed to solidify and crystallize. In step 1045, it is determined whether there are any more rows of the sample 170 that is to be subjected to the irradiation, i.e., whether the irradiation, melting and resolidification of the semiconductor thin film 175 has been completed. If not, in step 1050, the sample 175 is translated so that the line-type beam impinges the next row of the sample 170, and the processing is returned to step 1030 for irradiating of the current row of the semiconductor thin film 175. However, if in step 1045, it is determined that the irradiation and crystallization of the sample 170 is completed, and the hardware components and the beam 111 of the system shown in FIG. 1A can be shut off, and the process is terminated in step 1055.

Using the system and process according to the present invention, it is possible to obtain a significantly greater crystallization rate over that of the conventional systems and processes. This crystallization rate is provided as follows:

Crystallization Rate=Beam Length×Frequency of Laser×Pitch

For example, the crystallization rate effectuated by conventional system and process is:

50 cm×20 µm×300 Hz=30 cm$^2$/sec (for a 20 shot process)

In contrast, the crystallization rate afforded by the system and process according to the present invention is:

50 cm×300 µm×300 Hz=450 cm$^2$/sec.

The foregoing merely illustrates the principles of the invention. Various modifications and alterations to the described embodiments will be apparent to those skilled in the art in view of the teachings herein. For example, while the above embodiment has been described with respect to at least partial or full solidification and crystallization of the semiconductor thin film, it may apply to other materials processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the above-referenced patent application can also be utilized with the process and system of the present invention so long as a line-type beam pulses are generated. It will thus be appreciated that those skilled in the art will be able to devise numerous systems and methods which, although not explicitly shown or described herein, embody the principles of the invention and are thus within the spirit and scope of the present invention.

What is claimed is:

1. A method for processing at least one section of a thin film sample on a substrate, comprising the steps of:
   (a) controlling an irradiation beam generator to emit successive irradiation beam pulses at a predetermined repetition rate;
   (b) shaping each of the irradiation beam pulses to define at least one line-type beam pulse, wherein a profile of each of the line-type beam pulses includes a top portion, a leading portion and a trailing portion, wherein the top portion of each of the line-type beam pulses has an energy density which is above a complete melting threshold, the at least one line-type beam pulse being provided for impinging the film sample;
   (c) irradiating a first portion of the film sample with at least the top portion of a first one of the line-type beam pulses, to at least partially melt the first portion, the irradiated first portion being allowed to resolidify and crystallize to form approximately uniform areas therein, and
   (d) after step (c), irradiating a second portion of the film sample with at least the top portion of a second one of the line-type beam pulses to at least partially melt the second portion, the irradiated second portion being allowed to resolidify and crystallize to form approximately uniform areas therein,
   wherein an emission of the second one of the line-type beam pulses immediately follows an emission of the first one of the line-type beam pulses,
   wherein at least one section of the first portion of the film sample, corresponding to at least the top portion of the first one of the line-type beam pulses, is prevented from being irradiated by the trailing portion of the second one of the line-type beam pulses.

2. The method according to claim 1, wherein each of the leading and trailing portions of the first one of the line-type beam pulses irradiates a part of the first portion, and wherein each of the leading and trailing portions of the second one of the line-type beam pulses irradiates a part of the second portion.

3. The method according to claim 1,
   wherein each of leading and trailing portions of the first and second ones of the line-type beam pulses has first and second sections,
   wherein each of the first sections of the leading and trailing portions of the first and second ones of the line-type beam pulses has an energy density which is sufficient to at least partially melt at least one of the respective first portion and the respective second portion, and
   wherein each of the second sections of the leading and trailing portions of the first and second ones of the line-type beam pulses has an energy density lower than a threshold level which is sufficient to at least partially melt at least one of the respective first portion and the respective second portion.

4. The method according to claim 1, wherein step (d) is performed after step (c) is completed and after the film sample is translated for a particular distance with respect to an impingement by the beam pulses of the first portion.

5. The method according to claim 4, wherein the leading portion of the first one of the line-type beam pulses has a first length, wherein the top portion of the first one of the line-type pulses has a second length, and the trailing portion of the second one of the line-type beam pulses has a third length, and wherein the particular distance is greater than the sum of the first, second and third lengths.

6. The method according to claim 1, wherein a section of the leading portion of the first one of the line-type beam pulses that has an energy density that is between a complete melting threshold and a crystallization threshold and has a first length, wherein the top portion of the first one of the line-type pulses has an energy density that is above the complete melting threshold and has a second length, and the trailing portion of the second one of the line-type beam pulses has energy density that is below the complete melting threshold and has a third length, and wherein the particular distance at least a larger of the sum of the first and second lengths and the sum of the second and third lengths.

7. The method according to claim 1, wherein the beam pulse has a Gaussian shape.

8. The method according to claim 1, wherein the first portion of the film sample is irradiated by the top portion of the first one of the line-type beam pulses, wherein the second portion of the film sample is irradiated by the top portion of the second one of the line-type beam pulses, wherein the top portion of each of the first and second ones of the line-type beam pulses has an approximately constant energy density, and wherein the first and second irradiated areas are partially melted by the respective first and second ones of the line-type beam pulses.

9. The method according to claim 1, wherein no portion of the second one of the beam pulses irradiates any section of the first irradiated and resolidified area.

10. The method according to claim 1, wherein the at least one section of the first portion of the film sample that is prevented from being irradiated by the trailing portion of the second one of the line-type beam pulses includes an active region.

11. The method according to claim 1, wherein the first and second portions of the film sample include active regions of a thin film device.

12. The method according to claim 1, wherein the irradiation beam pulses are shaped by a mask to define the line-type beam pulses.

13. The method according to claim 1, further comprising the step of:
- (g) after step (c) and before step (d), translating the film sample for a particular distance with respect to an impingement by the beam pulses in a periodic manner and based on a frequency of the irradiation of the irradiation beam generator.

14. The method according to claim 1, wherein the first and second portions of the film sample include pixel areas.

15. The method according to claim 1, wherein the first and second portions include areas which are configured to situate thereon an active region of at least one thin-film transistor "TFT" device.

16. A method for processing at least one section of a thin film sample on a substrate, comprising the steps of:
- (a) controlling an irradiation beam generator to emit successive irradiation beam pulses at a predetermined repetition rate;
- (b) shaping each of the irradiation beam pulses to define at least one line-type beam pulse, wherein a profile of each of the line-type beam pulses includes a top portion, a leading portion and a trailing portion, wherein the top portion of each of the line-type beam pulses has an energy density which is below a complete melting threshold, the at least one line-type beam pulse being provided for impinging the film sample;
- (c) irradiating a first portion of the film sample with at least the top portion of a first one of the line-type beam pulses, to at least partially melt the first portion, the irradiated first portion being allowed to resolidify and crystallize to form approximately uniform areas therein, and
- (d) after step (c), irradiating a second portion of the film sample with at least the top portion of a second one of the line-type beam pulses to at least partially melt the second portion, the irradiated second portion being allowed to resolidify and crystallize to form approximately uniform areas therein, wherein an emission of the second one of the line-type beam pulses immediately follows an emission of the first one of the line-type beam pulses, wherein at least one section of the first portion of the film sample, corresponding to at least the top portion of the first one of the line-type beam pulses, is prevented from being irradiated by the trailing portion of the second one of the line-type beam pulses.

17. A method for processing at least one section of a thin film sample on a substrate, comprising the steps of:
- (a) controlling an irradiation beam generator to emit successive irradiation beam pulses at a predetermined repetition rate;
- (b) shaping each of the irradiation beam pulses to define at least one line-type beam pulse, wherein a profile of each of the line-type beam pulses includes a top portion, a leading portion and a trailing portion, wherein the top portion of each of the line-type beam pulses has an energy density which is above a complete melting threshold, the at least one line-type beam pulse being provided for impinging the film sample;
- (c) irradiating a first portion of the film sample with at least the top portion of a first one of the line-type beam pulses, to at least partially melt the first portion, the irradiated first portion being allowed to resolidify and crystallize to form approximately uniform areas therein, and
- (d) after step (c), irradiating a second portion of the film sample with at least the top portion of a second one of the line-type beam pulses to at least partially melt the second portion, the irradiated second portion being allowed to resolidify and crystallize to form approximately uniform areas therein, wherein an emission of the second one of the line-type beam pulses immediately follows an emission of the first one of the line-type beam pulses, wherein at least one section of the first portion of the film sample, corresponding to at least the top portion of the first one of the line-type beam pulses, is prevented from being irradiated by the trailing portion of the second one of the line-type beam pulses

- (e) receiving data associated with locations on the film sample to be irradiated; and
- (f) after step (c) and before step (d), translating the film sample for a particular distance with respect to an impingement by the beam pulses based on the received data.

18. A method for processing at least one section of a thin film sample on a substrate, comprising the steps of:
- (a) controlling an irradiation beam generator to emit successive irradiation beam pulses at a predetermined repetition rate;
- (b) shaping each of the irradiation beam pulses to define at least one line-type beam pulse, wherein a profile of each of the line-type beam pulses includes a top portion, a leading portion and a trailing portion, wherein the top portion of each of the line-type beam pulses has an energy density which is below a complete melting threshold, the at least one line-type beam pulse being provided for impinging the film sample;
- (c) irradiating a first portion of the film sample with at least the top portion of a first one of the line-type beam pulses, to at least partially melt the first portion, the irradiated first portion being allowed to resolidify and crystallize to form approximately uniform areas therein, and
- (d) after step (c), irradiating a second portion of the film sample with at least the top portion of a second one of the line-type beam pulses to at least partially melt the second portion, the irradiated second portion being allowed to resolidify and crystallize to form approximately uniform areas therein, wherein an emission of the second one of the line-type beam pulses immediately follows an emission of the first one of the line-type beam pulses, wherein at least one section of the first portion of the film sample, corresponding to at least the top portion of the first one of the line-type beam pulses, is prevented from being irradiated by the trailing portion of the second one of the line-type beam pulses

- (e) receiving data associated with locations on the film sample to be irradiated; and
- (f) after step (c) and before step (d), translating the film sample for a particular distance with respect to an impingement by the beam pulses based on the received data.

* * * * *